United States Patent [19]

Okamoto

[11] Patent Number: 5,703,511
[45] Date of Patent: Dec. 30, 1997

[54] CHARGE PUMP CIRCUIT, PLL CIRCUIT WITH CHARGE PUMP CIRCUIT, AND SEMICONDUCTOR INTEGRATED CIRCUIT WITH CHARGE PUMP CIRCUIT

[75] Inventor: Masaaki Okamoto, Kawasaki, Japan

[73] Assignee: Fujitsu Limited, Kawasaki, Japan

[21] Appl. No.: 735,997

[22] Filed: Oct. 23, 1996

[30] Foreign Application Priority Data

Jun. 19, 1996 [JP] Japan .................. 8-158013

[51] Int. Cl.$^6$ .................. H03L 7/089
[52] U.S. Cl. .................. 327/157; 327/148; 327/536; 327/537; 331/17
[58] Field of Search .................. 327/148–150, 327/157–159, 535–538, 540, 541; 331/17

[56] References Cited

U.S. PATENT DOCUMENTS

| | | | |
|---|---|---|---|
| 5,208,546 | 5/1993 | Nagaraj et al. .................. | 327/157 |
| 5,422,591 | 6/1995 | Rastegar et al. .................. | 327/537 |
| 5,477,193 | 12/1995 | Burchfield .................. | 331/17 |
| 5,546,031 | 8/1996 | Seesink .................. | 327/536 |

*Primary Examiner*—Timothy P. Callahan
*Assistant Examiner*—T. T. Lam
*Attorney, Agent, or Firm*—Nikaido, Marmelstein, Murray & Oram LLP

[57] ABSTRACT

A charge pump circuit has a first transistor connected to a first power source and having a control electrode to receive a first control signal; a second transistor connected to a second power source and having a control electrode to receive a second control signal; a third transistor and a current source connected in series between the first and second transistors, a node between the third transistor and the current source providing a signal, which is passed through a low-pass filter to provide a VCO input signal; and a control voltage generator for generating a control voltage according to the VCO input signal and applying the control voltage to a control electrode of the third transistor. This charge pump circuit realizes a stable PLL operation for a wide range of VCO input voltages, has little data rate dependency, and operates at high speed.

28 Claims, 23 Drawing Sheets

[WHEN UP SIGNAL IS APPLIED]

[WHEN DOWN SIGNAL IS APPLIED]

(CONTROL VOLTAGE GENERATOR)

Fig. 9 (CONTROL VOLTAGE GENERATOR)

CHARGE PUMP CIRCUIT, PLL CIRCUIT WITH CHARGE PUMP CIRCUIT, AND SEMICONDUCTOR INTEGRATED CIRCUIT WITH CHARGE PUMP CIRCUIT

BACKGROUND OF THE INVENTION

1. Field of the Invention

The present invention relates to a charge pump circuit, a phase-locked loop (PLL) circuit with a charge pump circuit, and a semiconductor integrated circuit with a charge pump circuit.

2. Description of the Related Art

A charge pump circuit is, for example, arranged in a PLL circuit, to transfer an error signal from a phase comparator to a voltage-controlled oscillator (VCO). The PLL circuit is incorporated, for example, in a clock recovery circuit, a clock generator, or a clock multiplier of a fiber-channel (fibre-channel) transceiver IC that also incorporates a multiplexer and a demultiplexer.

The charge pump circuit is, for example, constituted as a tri-state charge pump circuit. The phase comparator provides an error signal, and when the PLL circuit is locked, the level of the error signal must not completely be zero because the error signal of zero causes a dead zone to hinder a high-speed operation of the PLL circuit. Accordingly, the phase comparator provides an up and a down signal simultaneously or successively while the PLL circuit is locked.

Note that, when there is no up or down signal, the output of the charge pump circuit is at high impedance. Further, the outputs of the charge pump circuit must have the same area in order to lock the PLL circuit. When the PLL circuit is used for a clock recovery circuit of a fiber-channel transceiver IC, a relationship between the phases of input and output signals to and from the PLL circuit is important, and a phase deviation must be minimized. Further, the output of the PLL circuit must be unchanged with respect to a change in temperature or differences in the characteristics of samples.

If the charge pump circuit has data rate dependency, it will cause a phase deviation and jitter in the output of the PLL circuit and reduce a phase margin in the same. The data rate dependency of the charge pump circuit must be minimized.

Namely, the charge pump circuit must stabilize the operation of the PLL circuit for a wide range of input voltages supplied to the VCO, must be unaffected by a data rate, and must operate at high speed.

The problems of the prior art will be explained later in detail with reference to the accompanying drawings.

SUMMARY OF THE INVENTION

An object of the present invention is to provide a charge pump circuit capable of stabilizing the operation of a PLL circuit for a wide range of input voltages supplied to a VCO, being unaffected by a data rate, and operating at high speed. The present invention also provides a PLL circuit having the charge pump circuit, as well as a semiconductor integrated circuit having the charge pump circuit.

According to the present invention, there is provided a charge pump circuit comprising a first transistor connected to a first power source line and having a control electrode to receive a first control signal; a second transistor connected to a second power source line and having a control electrode to receive a second control signal; a third transistor and a current source connected in series between the first and second transistors, a node between the third transistor and the current source providing a signal, which is passed through a low-pass filter to provide a VCO input signal; and a control voltage generator for generating a control voltage according to the VCO input signal and applying the control voltage to a control electrode of the third transistor.

The first and second transistors may be enhancement transistors, and the third transistor and current source may be depletion transistors. The first to third transistors and current source may be Schottky-junction field effect transistors. The first to third transistors and current source may be metal-gate or silicon-gate field effect transistors, and at least one diode may be arranged between the control electrode of the third transistor and the node.

The control voltage generator may have two cascaded level shifters and two bias generators having different temperature coefficients to set separate temperature characteristics for shifting levels of the level shifters. The control voltage generator may have a positive-phase amplifier having feedback resistors to adjust a gain.

According to the present invention, there is also provided a phase-locked loop circuit having a phase comparator for comparing phases of reference and output signals with each other, a charge pump circuit for receiving first and second control signals from the phase comparator and providing corresponding signals, a low-pass filter for filtering an output of the charge pump circuit into a VCO input signal, and a voltage-controlled oscillator for generating a signal whose frequency is determined by the VCO input signal, wherein the charge pump circuit comprises a first transistor connected to a first power source line and having a control electrode to receive a first control signal; a second transistor connected to a second power source line and having a control electrode to receive a second control signal; a third transistor and a current source connected in series between the first and second transistors, a node between the third transistor and the current source providing a signal, which is passed through a low-pass filter to provide a VCO input signal; and a control voltage generator for generating a control voltage according to the VCO input signal and applying the control voltage to a control electrode of the third transistor.

The phase-locked loop circuit may further comprise a clamp circuit for controlling the first control signal supplied to the control electrode of the first transistor, the clamp circuit receiving the VCO input signal and clamping an amplitude of the first control signal irrespective of a fluctuation in the VCO input signal. The clamp circuit may have an inverter, and a potential of the second power source line applied to the inverter may be changed according to the VCO input signal.

The phase-locked loop circuit may comprise a control signal processor arranged in front of the first and second transistors, to enhance the edges of the first and second control signals. The control signal processor may comprise a first delay circuit for delaying the first control signal and supplying the delayed signal to the control electrode of the first transistor; a first chopper for generating a narrow pulse in response to a second edge of each pulse of the first control signal and using the pulse to enhance the second edge; a fourth transistor controlled by the output of the first chopper; a second delay circuit for delaying the second control signal and supplying the delayed signal to the control electrode of the second transistor; a second chopper for generating a narrow pulse in response to a second edge of each pulse of the second control signal and using the pulse to enhance the second edge; and a fifth transistor controlled by an output of the second chopper.

Each of the first and second choppers may include an odd number of inverters and a two-input NOR gate, a corresponding one of the first and second control signals being supplied through the inverters to an input terminal of the NOR gate and directly to another input terminal of the NOR gate.

Further, according to the present invention, there is provided a semiconductor integrated circuit having a multiplexer for multiplexing low-speed parallel data composed of a plurality of bits into high-speed serial data, a clock generator for receiving a reference clock signal and generating a clock signal for the multiplexer, a demultiplexer for demultiplexing high-speed serial data into low-speed parallel data composed of a plurality of bits, and a clock recovery circuit for receiving the high-speed serial data and generating a clock signal for the demultiplexer, wherein the clock recovery circuit includes a phase-locked loop circuit having a phase comparator for comparing phases of reference and output signals with each other, a charge pump circuit for receiving first and second control signals from the phase comparator and providing corresponding signals, a low-pass filter for filtering an output of the charge pump circuit into a VCO input signal, and a voltage-controlled oscillator for generating a signal whose frequency is determined by the VCO input signal, wherein the charge pump circuit comprises a first transistor connected to a first power source line and having a control electrode to receive a first control signal; a second transistor connected to a second power source line and having a control electrode to receive a second control signal; a third transistor and a current source connected in series between the first and second transistors, a node between the third transistor and the current source providing a signal, which is passed through a low-pass filter to provide a VCO input signal; and a control voltage generator for generating a control voltage according to the VCO input signal and applying the control voltage to a control electrode of the third transistor.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problem in the prior art will be explained with reference to FIGS. 1 to 4.

Figure 1:
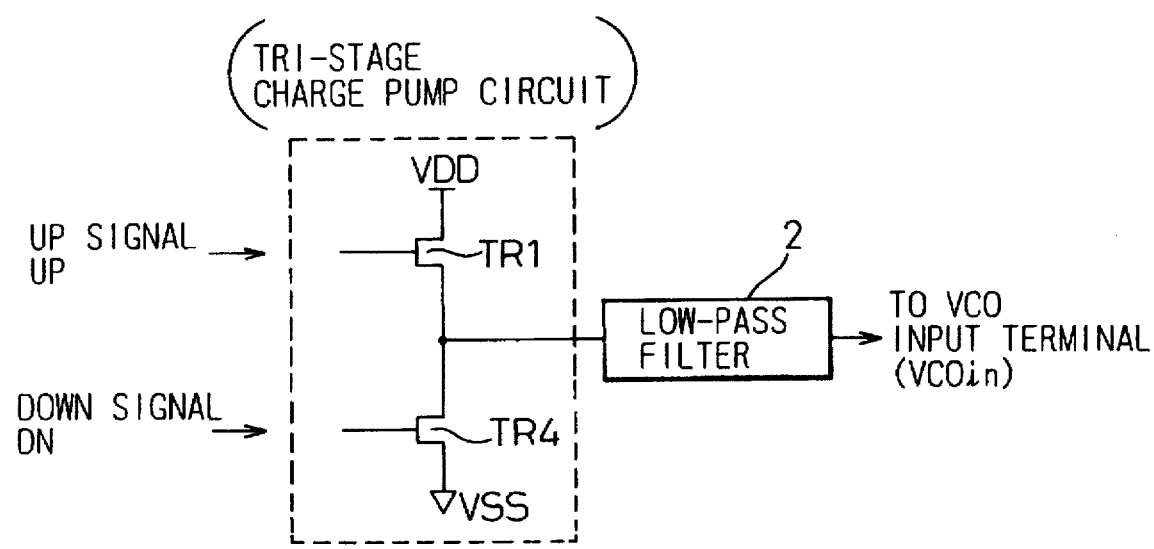
FIG. 1 shows a charge pump circuit according to a prior art.
Figure 2:
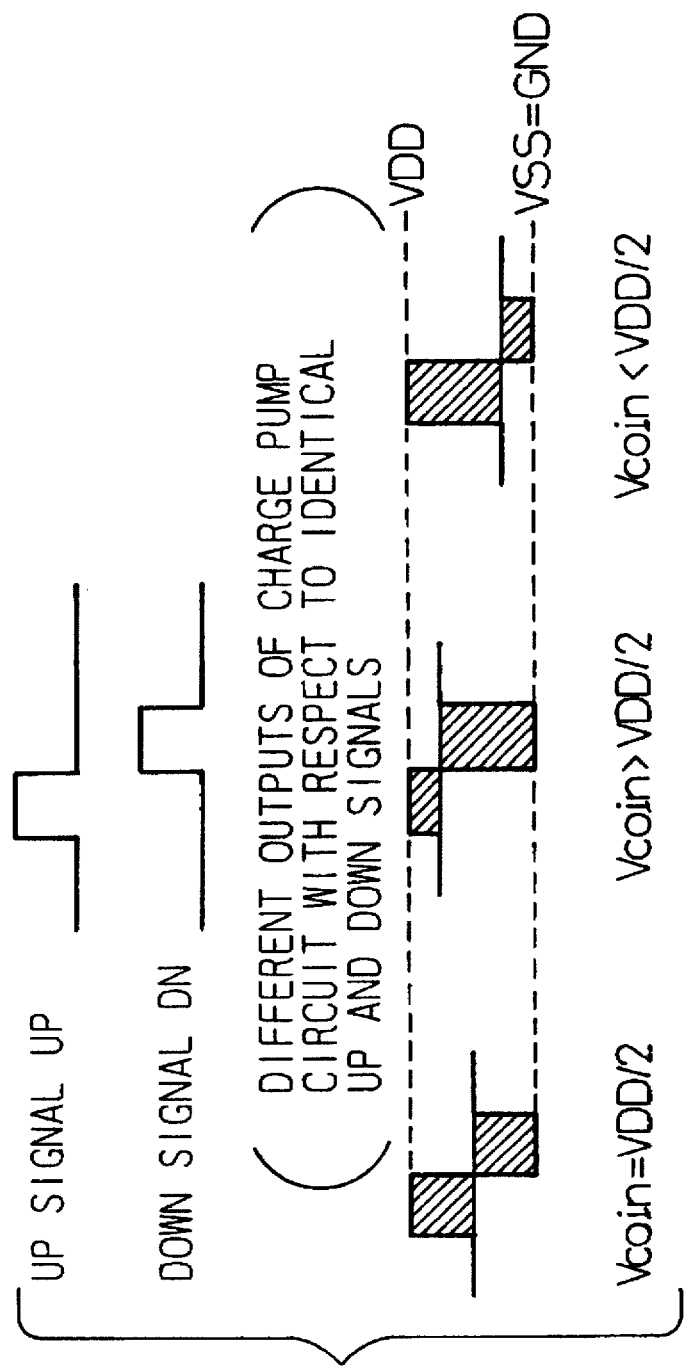
FIG. 2 shows the problem of the charge pump circuit of FIG. 1.

FIG. 1 shows a tri-state charge pump circuit according to the prior art, and FIG. 2 shows the problem thereof. The charge pump circuit, a phase comparator, a low-pass filter 2, and a voltage-controlled oscillator (VCO) form a phase-locked loop (PLL) circuit.

The phase comparator provides an error signal. When the PLL circuit is locked, the level of the error signal must not completely be zero because the error signal of zero causes a dead zone to hinder a high-speed operation of the PLL circuit. Accordingly, the phase comparator provides an up signal UP and a down signal DN simultaneously or successively while the PLL circuit is locked. If an average of the levels of the up and down signals is zero, a control signal to the VCO will be zero.

The charge pump circuit has transistors TR1 and TR4. The gate of the transistor TR1 receives the up signal UP from the phase comparator, and the gate of the transistor TR4 receives the down signal DN from the phase comparator. To increase the frequency of the output of the VCO, the phase comparator provides the charge pump circuit with the up signal UP, and to decrease the same, the down signal DN. Thereafter, the frequency of the PLL circuit is locked. The transistors TR1 and TR4 are each a Schottky-junction field effect transistor such as an n-type enhancement MESFET.

The output of the charge pump circuit is passed through the low-pass filter 2 and to the VCO. The output of the charge pump circuit rises to high level VDD in response to the up signal UP and falls to low level VSS in response to the down signal DN. When there is no up or down signal, the output of the charge pump circuit is at high impedance Z.

In this way, the amplitude of the output of the charge pump circuit ranges from VDD to VSS. An input voltage applied to the VCO while the PLL circuit is being locked is VCOin, which is determined by the input voltage-to-frequency characteristic of the VCO and fluctuates depending on samples. The amplitude of the output of the charge pump circuit is expressed as follows:

$V_{up} = VDD - VCOin$ $V_{dn} = -(VCOin - VSS)$ where Vup corresponds to the up signal UP and Vdn to the down signal DN. Vup and Vdn are symmetrical only when VCOin=(VDD−VSS)/2.

If the up and down signals UP and DN have the same width and if Vup and Vdn are asymmetrical, an averaged output of the charge pump circuit deviates from VCOin. Then, the PLL circuit will not be locked. To lock the PLL circuit, the outputs Vup and Vdn of the charge pump circuit must have the same area. To achieve this, the up and down signals UP and DN must have a phase difference, i.e., a time difference. This, however, involves a phase deviation (offset) when the PLL circuit is locked.

When the PLL circuit is used for a clock recovery circuit of a fiber-channel transceiver IC, a relationship between the phases of input and output signals to and from the PLL circuit is important. Accordingly, such phase deviation must be minimized. In addition, the output of the PLL circuit must be unchanged with respect to a change in temperature or a difference in the characteristics of samples.

If the charge pump circuit has data rate dependency, it will cause a phase deviation and jitter in the output of the PLL circuit and reduce a phase margin in the same. The data rate dependency of the charge pump circuit must be minimized.

Figure 3:
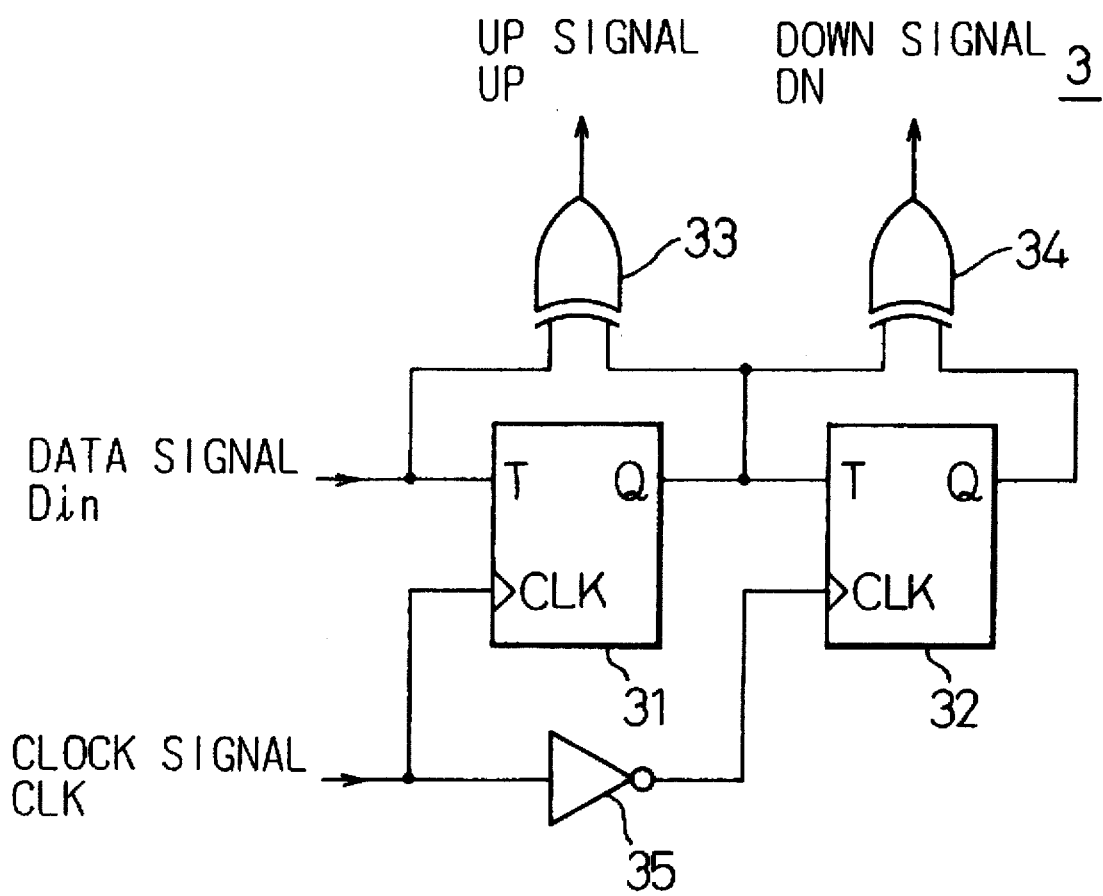
FIG. 3 shows a phase comparator of a clock recovery circuit of a semiconductor integrated circuit.
Figure 4:
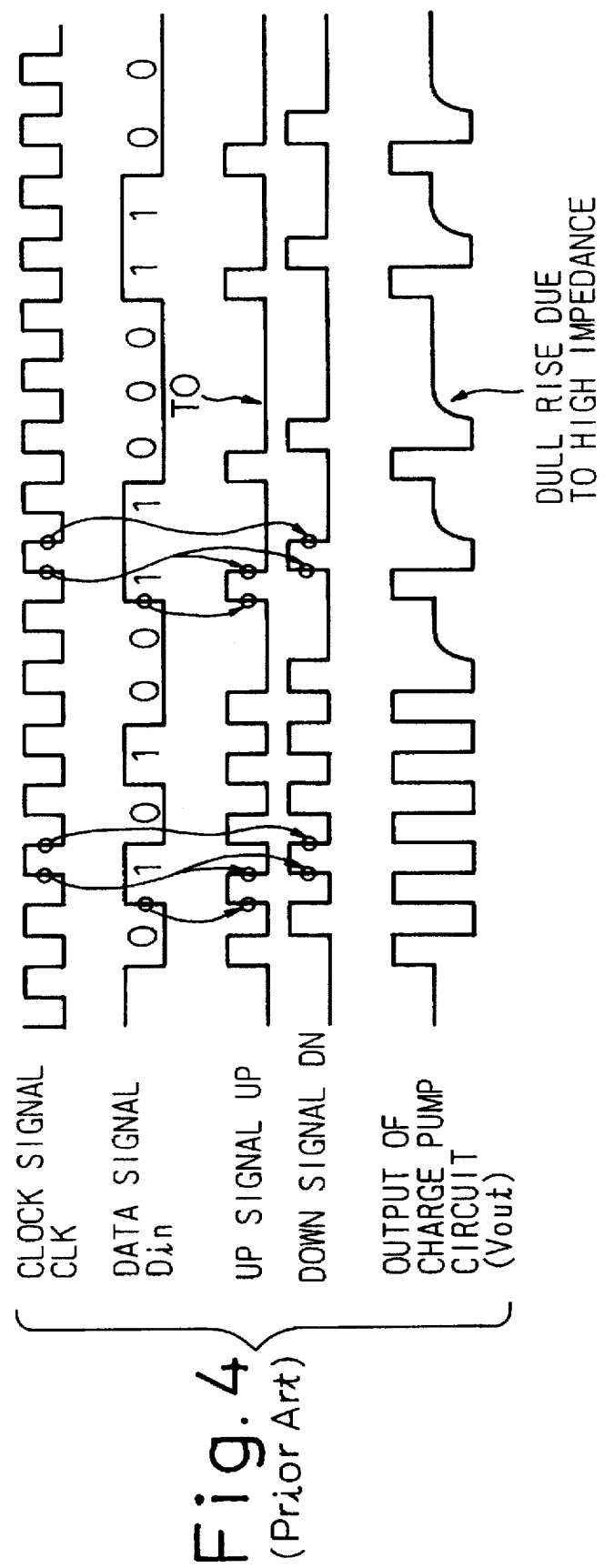
FIG. 4 shows the problem of the charge pump circuit of FIG. 1 that receives the outputs of the phase comparator of FIG. 3.

FIG. 3 shows an example of the phase comparator of the PLL circuit of the clock recovery circuit of the fiber-channel transceiver IC. FIG. 4 shows the problem of the charge pump circuit that receives the outputs of the phase comparator of FIG. 3.

The phase comparator 3 consists of flip-flops 31 and 32, exclusive OR gates 33 and 34, and an inverter 35. The flip-flop 31 receives a data signal Din at a rate of, for example, 1 Gb/s and a clock signal CLK at a rate of, for example, 1 GHz. The inverter 35 inverts the clock signal CLK and supplies the inverted signal to the flip-flip 32. The phase comparator 3 provides the up signal UP that ranges from a changing point of the data signal Din to the next rise of the clock signal CLK, as well as the down signal DN that ranges from a rise of the clock signal CLK that follows the changing point of the data signal Din to the next fall of the clock signal CLK, as shown in FIG. 4.

When the data signal Din alternates in synchronization with each period of the clock signal CLK, the frequency of the output Vout of the charge pump circuit is the same as that of the clock signal CLK. In this case, each falling or rising edge of the output Vout is steep.

When the data signal Din alternates slowly as, for example, at timing T0 of FIG. 4, the up signal UP first falls and then the down signal DN falls. Consequently, the transistors TR1 and TR4 (FIG. 1) of the charge pump circuit are both turned off to provide a high-impedance output. In this case, the output Vout of the charge pump circuit corresponding to the down signal DN rises gently, to increase the area thereof. This results in delaying the phase of the output of the PLL circuit, decreasing the phase margin thereof, and causing jitter in the same.

In this way, the output of the PLL circuit having the charge pump circuit of FIG. 1 fluctuates during a locked state due to a fluctuation in an input voltage to the VCO. In addition, the data rate dependency of the charge pump circuit fluctuates the output of the PLL circuit, deteriorates the phase margin of the same, and causes jitter in the same.

Next, charge pump circuits, PLL circuits with a charge pump circuit, and semiconductor integrated circuits with a charge pump circuit according to the present invention will be explained.

Figure 5:
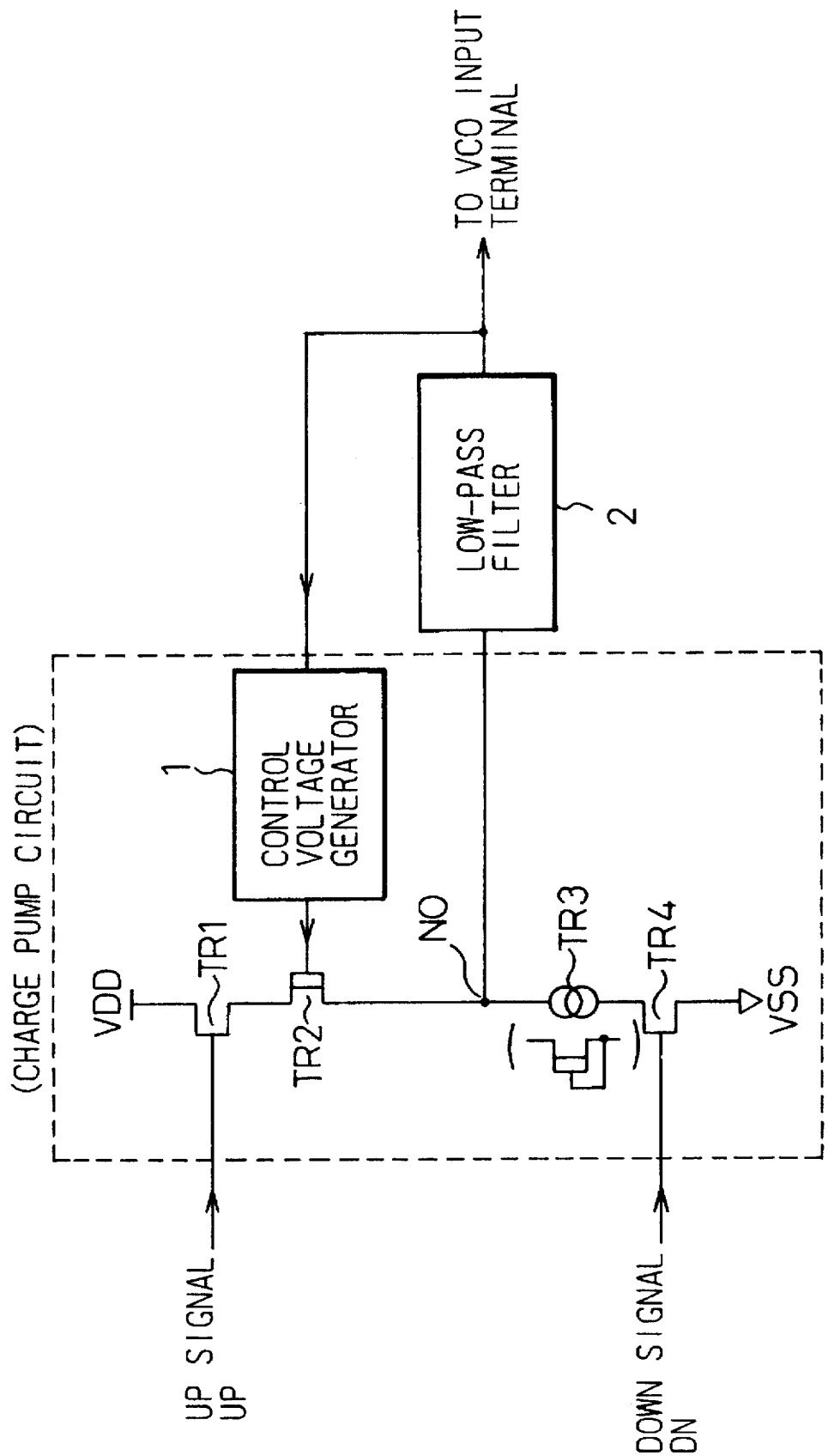
FIG. 5 shows a charge pump circuit according to a first embodiment of the present invention.

FIG. 5 shows a charge pump circuit according to the first embodiment of the present invention.

The charge pump circuit consists of driver transistors TR1 and TR4 corresponding to the transistors TR1 and TR4 of the prior art of FIG. 1, a transistor TR2, a current source transistor TR3, and a control voltage generator 1. The transistors TR2 and TR3 are arranged between the transistors TR1 and TR4. The gate of the transistor TR2 receives the output of the control voltage generator 1. The transistors TR1 and TR4 are each a Schottky-junction field effect transistor such as an n-type enhancement MESFET. The transistors TR2 and TR3 are each an n-type depletion MESFET. A signal from a node NO between the transistor TR2 and the current source TR3 is supplied to a low-pass filter 2, which provides a VCO input voltage to the control voltage generator 1 and a voltage-controlled oscillator (VCO).

The control voltage generator 1 monitors the VCO input voltage and generates a control voltage accordingly. The control voltage generator 1 must accept a high-impedance input and provide a low-impedance output.

The control voltage from the control voltage generator 1 fixes the amplitude Vup of the output of the charge pump circuit corresponding to an up signal UP, so that Vup never fully swings to a power source voltage, unlike the prior art of FIG. 1.

On the other hand, the amplitude Vdn of the output of the charge pump circuit corresponding to a down signal DN is controlled by the clamp voltage of a Schottky gate diode that is equivalently present between the gate and source of the transistor TR2. Namely, the amplitude Vdn is also controlled by the control voltage of the control voltage generator 1 so that it is stable irrespective of the VCO input voltage. The current source transistor TR3 may be of the same type as the transistor TR2. For example, the transistor TR3 is an n-type depletion MESFET of the same size as the transistor TR2. The charge pump circuit may be integrated with the transistors TR2 and TR3 having the same threshold voltage. Even if the amplitude Vup changes according to the threshold voltage, a current flowing through the Schottky gate diode also changes to change the clamp voltage. Namely, the symmetry of the up and down outputs of the charge pump circuit is secured irrespective of a fluctuation in the threshold voltage of the transistor TR2.

Figure 6:
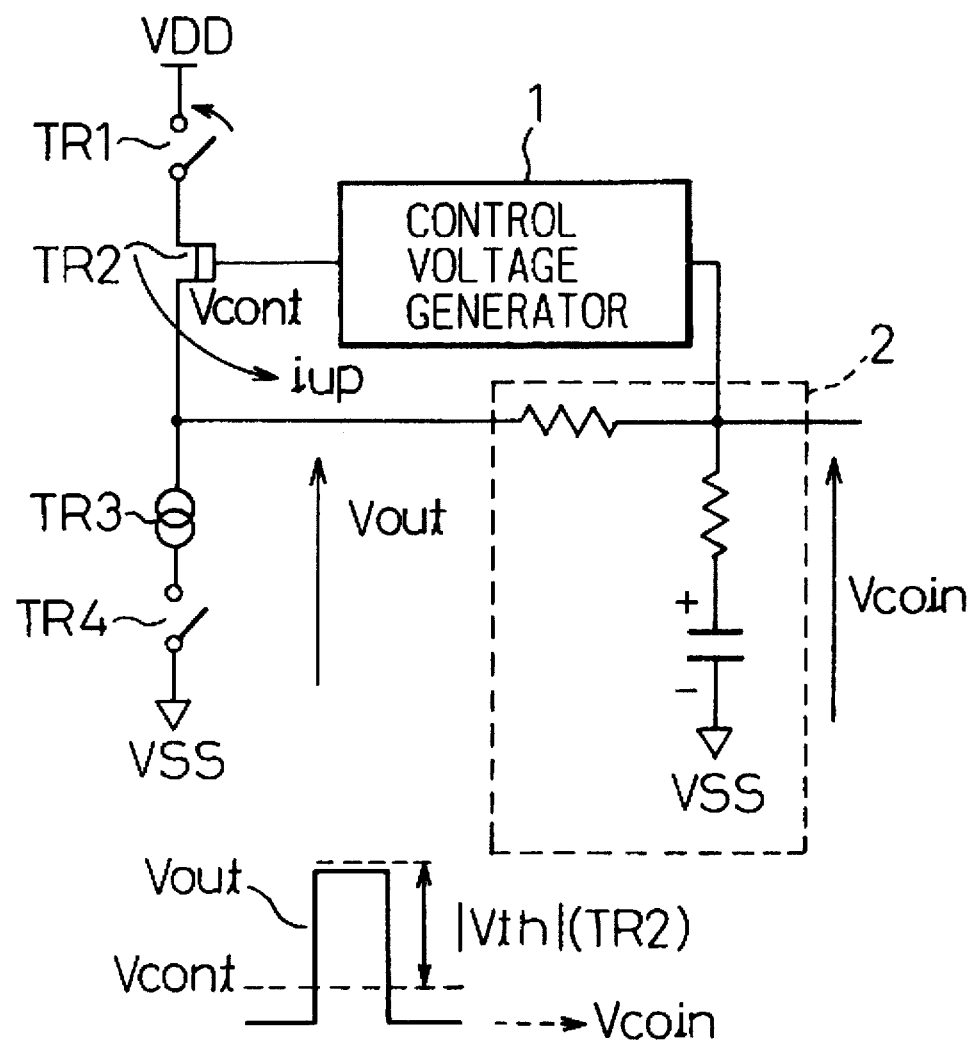
FIG. 6 shows an operation (1) of the circuit of FIG. 5.
Figure 7:
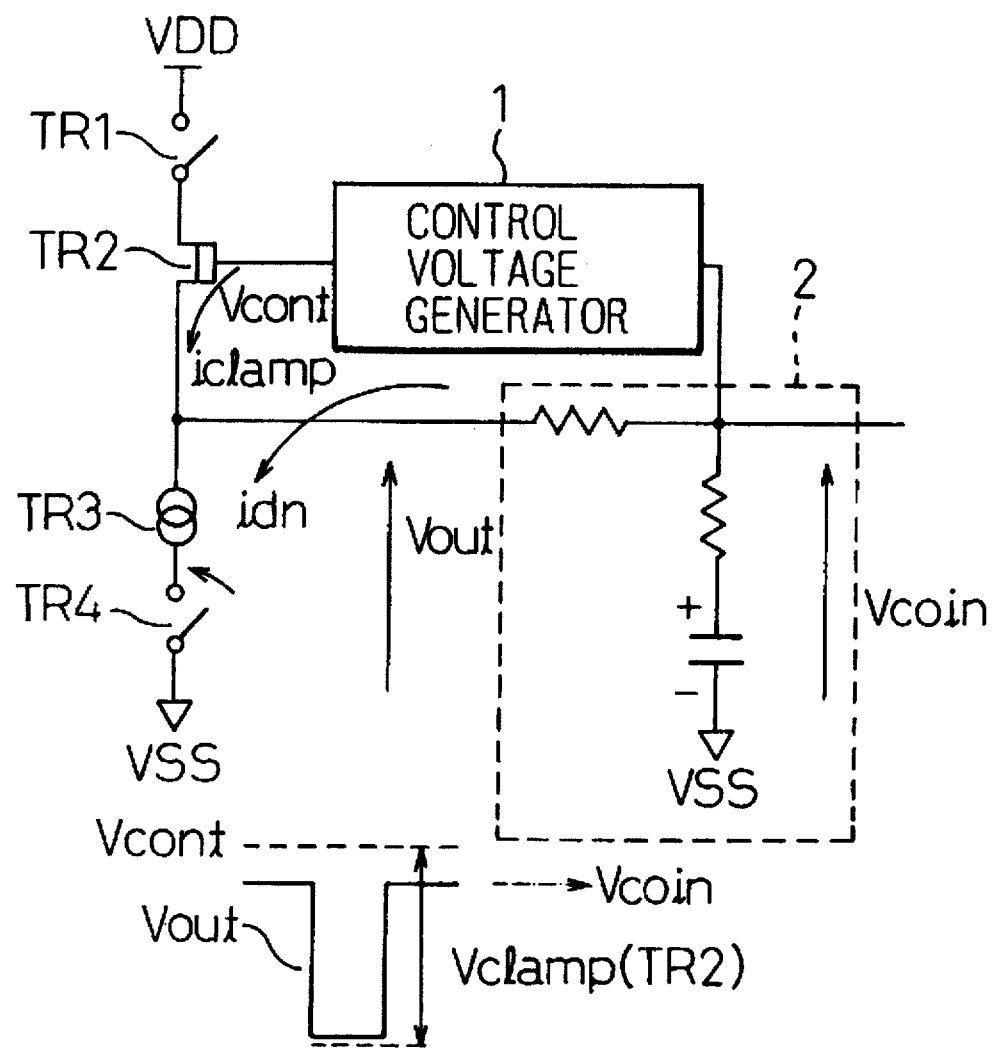
FIG. 7 shows an operation (2) of the circuit of FIG. 5.

FIG. 6 shows the operation of the charge pump circuit with respect to the up signal UP, and FIG. 7 shows the same with respect to the down signal DN. The VCO input voltage (VCOin) is equal to the direct-current level of an output voltage Vout of the charge pump circuit when the charge pump circuit is in a high-impedance state.

The up signal UP turns on the transistor TR1 to pass a charging current (iup) from a high-voltage power source VDD to an output terminal of the charge pump circuit. As a result, the output Vout of the charge pump circuit becomes higher than the VCO input voltage by a voltage produced by a resistor. An increase in the output voltage Vout is restricted as follows:

$$Vcont - Vout = Vth \ (Vth < 0)$$

where Vcont is a control voltage applied by the control voltage generator 1 to the gate of the transistor TR2, and Vth is the threshold voltage of the transistor TR2. Vout is nearly equal to Vcont−Vth.

In FIG. 7, the down signal DN turns on the transistor TR4 to pass a discharging current (idn) from the output terminal of the charge pump circuit. As a result, the output voltage Vout of the charge pump circuit becomes lower than the VCO input voltage by a voltage produced by the resistor. A decrease in the output voltage Vout is restricted as follows:

$$Vout = Vcont - Vclamp$$

where Vclamp is an intersection between the I-V characteristic of the Schottky gate diode of the transistor TR2 and a current from the current source TR3.

A shifting level Vls on the control voltage Vcont of the control voltage generator 1 may be set as follows:

$$Vcont = VCOin + Vls$$

$$Vls = (Vth + Vclamp)/2$$

Then, a high-level output Voutup of the charge pump circuit corresponding to the up signal UP is as follows:

$$Voutup = VCOin + (Vclamp - Vth)/2$$

A low-level output Voutdn of the charge pump circuit corresponding to the down signal DN is as follows:

$$Voutdn = VCOin - (Vclamp - Vth)/2$$

Namely, the amplitude of the output of the charge pump circuit that is in a high-impedance state ranges between plus and minus (Vclamp−Vth)/2 around VCOin that is an input voltage to VCO to lock the PLL circuit. In this way, the first embodiment is capable of maintaining the symmetry of the amplitudes of the outputs Voutup and Voutdn of the charge pump circuit even if the VCO input voltage is not equal to VDD/2, to thereby expand the operational range of the charge pump circuit.

The phase comparator that provides the up and down signals UP and DN may be the one shown in FIG. 3.

Figure 8:
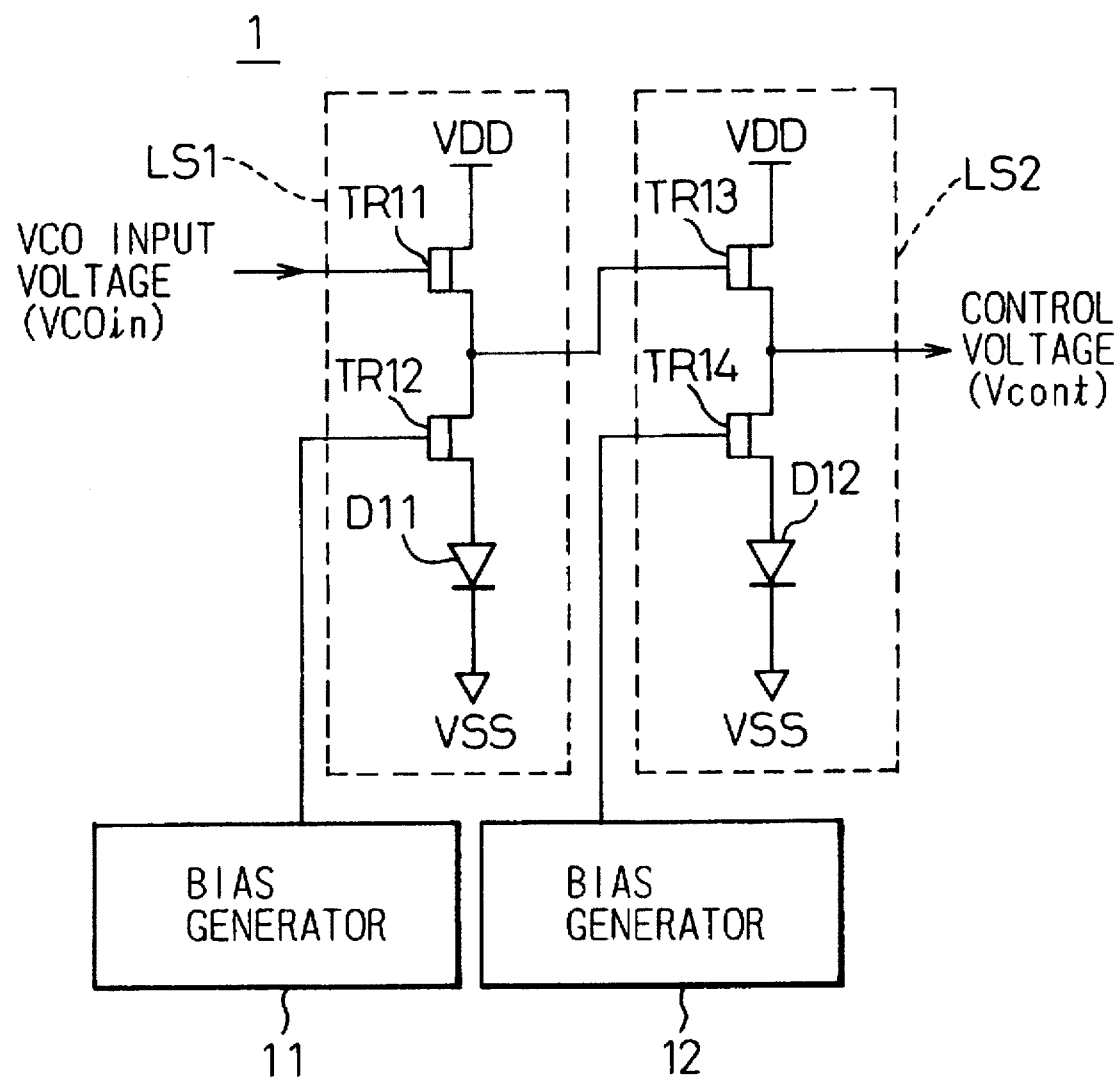
FIG. 8 shows a charge pump circuit according to a second embodiment of the present invention.

FIG. 8 shows a control voltage generator 1 of a charge pump circuit according to the second embodiment of the present invention. The control voltage generator 1 consists of n-type depletion MESFETs TR11 to TR14, diodes D11 and D12, and bias generators 11 and 12.

The first embodiment of FIGS. 5 to 7 is intended to maintain the output amplitudes of a charge pump circuit around a VCO input voltage. The amplitude of the output of the charge pump circuit corresponding to a down signal DN is determined not only by the control and threshold voltages of the transistor TR2 but also by the clamp voltage of the Schottky gate diode thereof. A fluctuation in the clamp voltage due to, for example, a change in temperature may decrease the output of the charge pump circuit corresponding to the down signal DN.

The second embodiment of FIG. 8 solves this problem by using the diodes D11 and D12.

The transistors TR11 and TR12 and diode D11 form a level shifter LS1, which is connected to a bias generator 11. The transistors TR13 and TR14 and diode D12 form a level shifter LS2, which is connected to a bias generator 12. The bias generators 11 and 12 have different temperature coefficients.

If any one of the bias generators has a negative temperature coefficient, the corresponding level shifter will have small temperature dependency, and therefore, be proper to set a shifting level. If any one of the bias generators has a positive temperature coefficient, the corresponding level shifter will have large temperature dependency, and the temperature characteristic thereof will be equalized with that of the clamp voltage of the transistor TR2. The bias generators 11 and 12 control the bias voltages of the level shifters LS1 and LS2, i.e., the gate voltages of the transistors TR12 and TR14, to set a shifting level to correct a temperature fluctuation.

When a shifting level of the control voltage generator 1 is Vls=(Vth+Vclamp)/2, the symmetry of the output amplitudes of the charge pump circuit is secured. If the threshold of the transistor TR2 fluctuates under this state, a current from the transistor TR3 also fluctuates. As a result, the clamp voltage Vclamp of the transistor TR2 also fluctuates because the clamp voltage Vclamp is at an intersection between the I-V characteristic of the Schottky gate diode of the transistor TR2 and the current from the current source transistor TR3. Consequently, Vls=(Vth+Vclamp)/2 is secured. The clamp voltage Vclamp fluctuates irrespective of the threshold voltage Vth of the transistor TR2, and therefore, Vls=(Vth+Vclamp)/2 is not satisfied if Vls is unchanged. This is why Vls must have a fluctuation coefficient in the forward direction of the diode.

Figure 9:
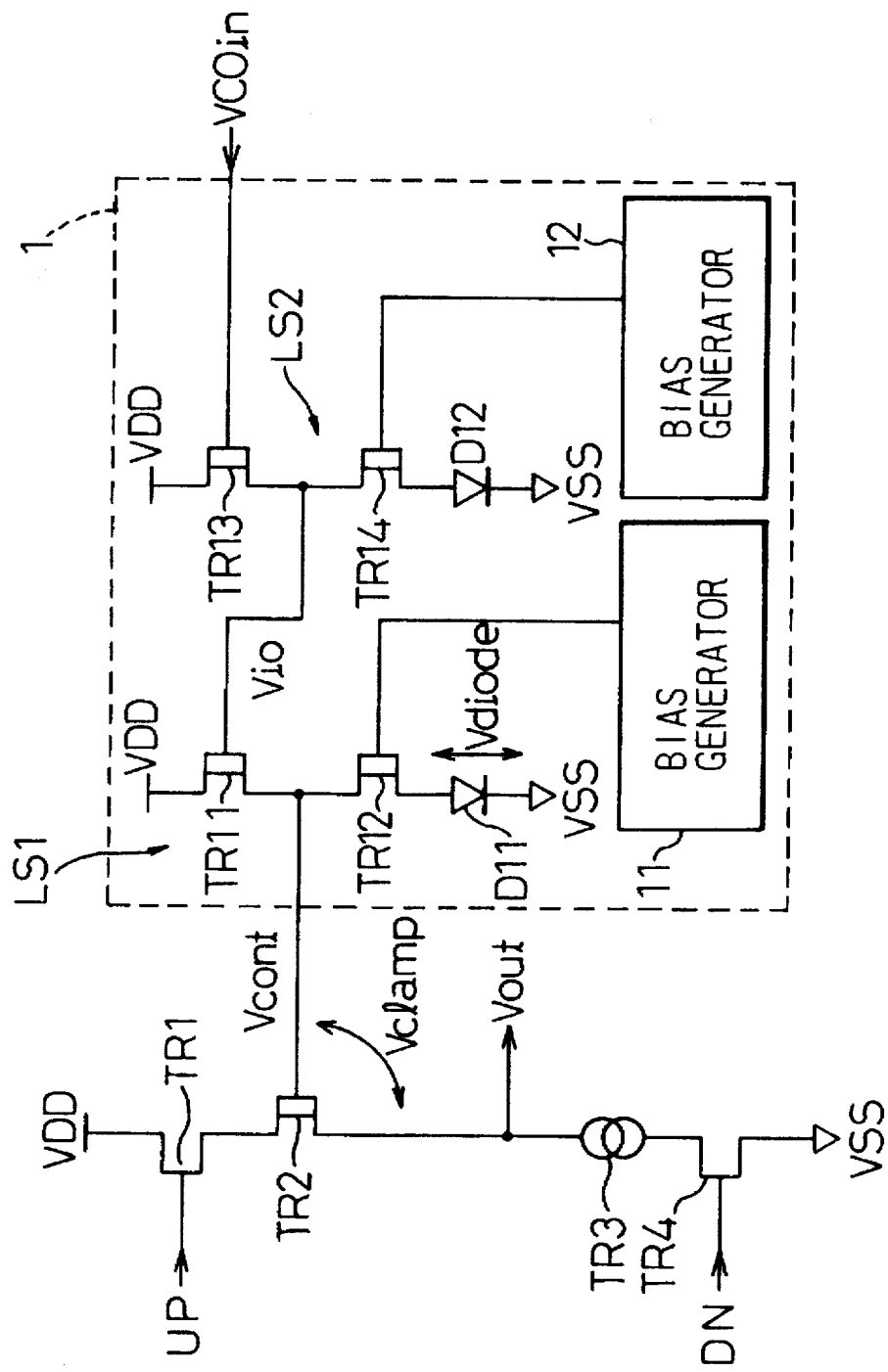
FIG. 9 shows an operation of the circuit of FIG. 8.

FIG. 9 shows the operation of the charge pump circuit of FIG. 8.

If the clamp voltage Vclamp of the transistor TR2 decreases due to, for example, a temperature increase, a clamp voltage Vdiode of the diode D11 decreases. As a result, the gate voltage of the transistor TR12 increases to increase a current to pass. Then, the gate voltage of the transistor TR11 increases to decrease the control voltage Vcont. In this way, if the clamp voltage Vclamp decreases, the shifting level Vls on the control voltage Vcont changes to a negative side to maintain the symmetry of the output amplitudes of the charge pump circuit.

To change the shifting level Vls according to the diode characteristic of the transistor TR2, the transistors TR11 and TR12 must have like sizes. When the transistors TR11 and TR12 have like sizes, however, the shifting level Vls is not freely set. Accordingly, the embodiment of FIG. 8 employs the two level shifters LS1 and LS2, so that one of the level shifters may have transistors of different sizes to freely set the shifting level Vls and the other may have transistors of the same size to provide a diode characteristic. The two-level-shifter arrangement may prevent a decrease in input impedance of the control voltage generator 1 when a clamp current passes through the transistor TR2.

The charge pump circuit of any one of the first and second embodiments is capable of operating on a wide range of VCO input voltages. To further expand the operational range of the charge pump circuit, asymmetry due to the difference between the drain voltages of the transistors TR2 and TR3 is a problem. The third embodiment solves this problem by providing the control voltage generator 1 with a gain to correct the drain voltage difference with a gate voltage.

Figure 10:
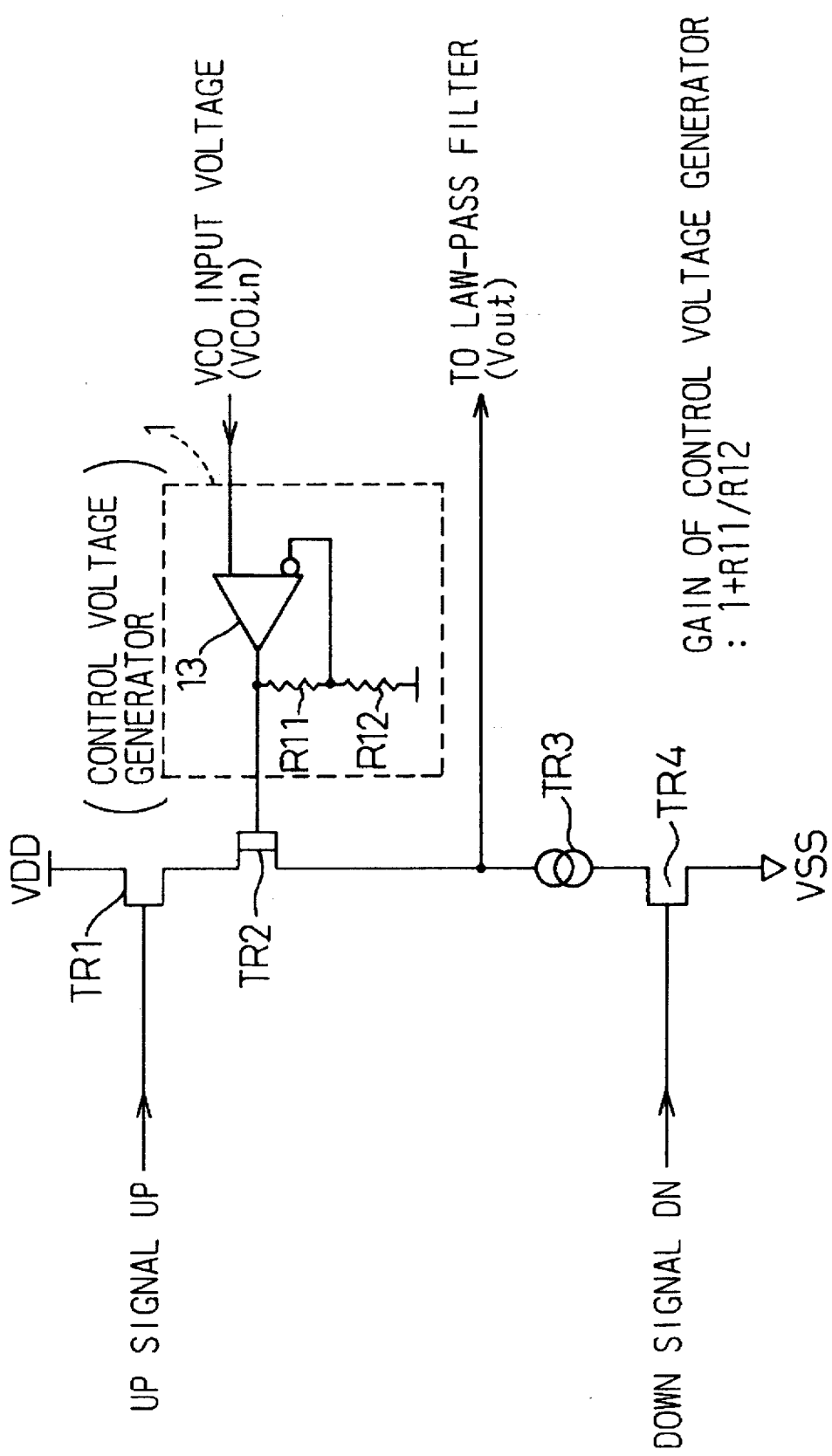
FIG. 10 shows a charge pump circuit according to a third embodiment of the present invention.

FIG. 10 shows a charge pump circuit according to the third embodiment of the present invention.

A control voltage generator 1 consists of a positive phase amplifier 13 and resistors R11 and R12. An input terminal of the amplifier 13 receives an input voltage (VCOin) to a VCO. The output of the amplifier 13 is divided by the resistors R11 and R12, and the divided one is inverted and fed back to the other input terminal of the amplifier 13.

The amplifier 13 provides the control voltage generator 1 with a gain to correct a drain voltage difference with a gate voltage.

Figure 11:
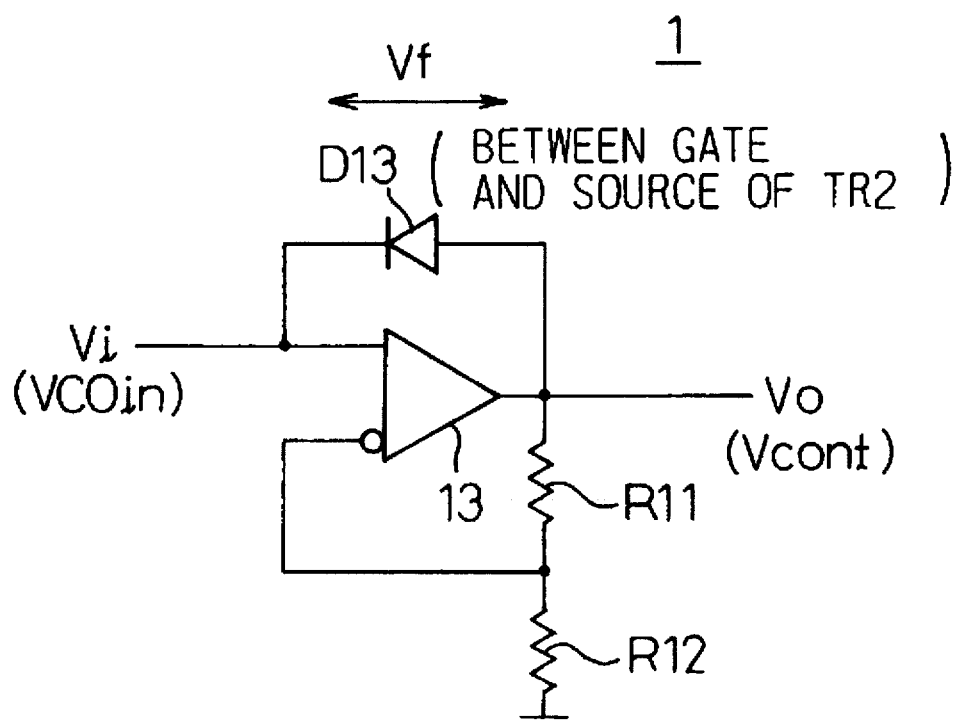
FIG. 11 shows an operation of the circuit of FIG. 10.

FIG. 11 shows the operation of the charge pump circuit of FIG. 10. A reference mark D13 indicates an equivalent Schottky gate diode that is present between the gate and source of a transistor TR2.

If the VCO input voltage greatly deviates from VDD/2, the transistors TR2 and TR3 will not saturate. Currents passing through the transistors TR2 and TR3 are affected by the asymmetry of drain voltages, to hinder the operation of the charge pump circuit. To solve this problem, the gain of the control voltage generator 1 is increased slightly larger than 1 with the use of a negative feedback loop of the amplifier 13.

The amplifier 13 has positive and negative feedback loops as shown in FIG. 11. The positive feedback loop must be disabled when the charge pump circuit is in a high-impedance state, otherwise a direct-current level during the high-impedance state is affected. Namely, the Schottky gate diode of the transistor TR2 must be OFF when the charge pump circuit is in the high-impedance state. To achieve this, the following must be satisfied:

$$Vo-Vi<Vf$$

where Vo is a control voltage Vcont supplied by the control voltage generator 1 to the gate of the transistor TR2, and Vi is the VCO input voltage. The gain of the amplifier 13 is as follows:

$$Gain<1+Vf/Vi$$

When this is satisfied, the following is established:

$$Gain=1+R11/R12$$

Namely, the gain of the amplifier 13 is determined according to the resistors R11 and R12.

In this way, this embodiment provides the control voltage generator 1 with a voltage gain, to compensate for the drain voltage asymmetry of the transistors TR2 and TR3 and to operate the charge pump circuit on a wide range of VCO input voltages.

Figure 12:
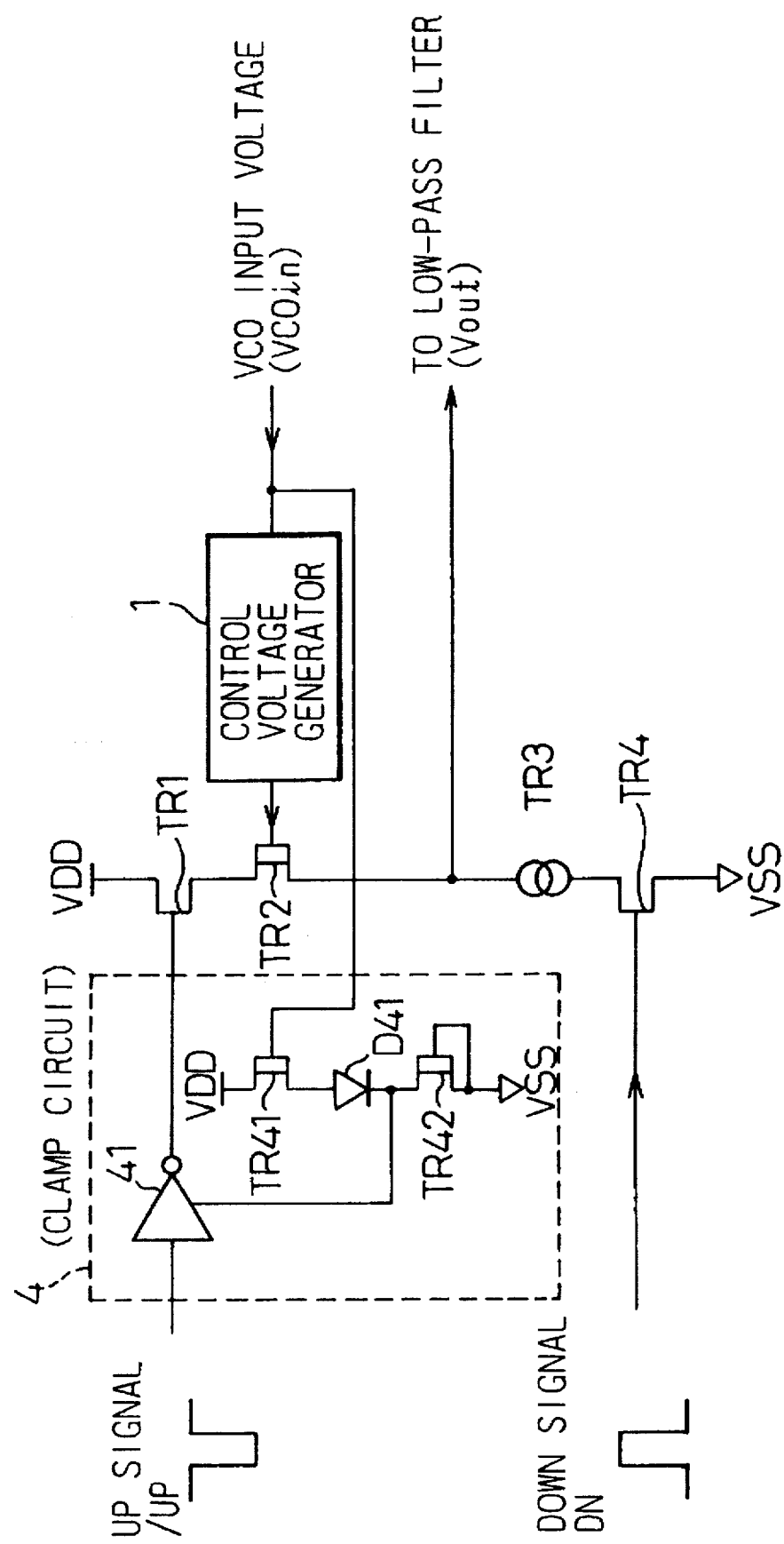
FIG. 12 shows a charge pump circuit according to a fourth embodiment of the present invention.

FIG. 12 shows a charge pump circuit according to the fourth embodiment of the present invention. This embodiment realizes a high-speed operation of the charge pump circuit.

The amplitude of an input voltage to a transistor TR1 ranges from a low level Vol to a threshold level Vth. This range is greater than that of a transistor TR4, to hinder a high-speed operation. The threshold voltage Vth is dependent on a VCO input voltage (VCOin). If the VCO input voltage and low-level input voltage Vol act similarly, the amplitude of the input signal to the transistor TR1 will be reduced without deteriorating a level margin.

The fourth embodiment supplies an up signal UP to the gate of the transistor TR1 through a clamp circuit 4. The clamp circuit 4 consists of an n-type enhancement MESFET TR41, a diode D41, an n-type depletion MESFET TR42, and an inverter 41. The transistor TR41, diode D41, and transistor TR42 are totem-pole-connected between a high-voltage power source VDD and a low-voltage power source VSS. The level of the power source VSS applied to the inverter 41 is changed according to the VCO input voltage, to make the amplitude of the output of the inverter 41 applied to the gate of the transistor TR1 constant. This embodiment employs an inverted up signal/UP.

Figure 13:
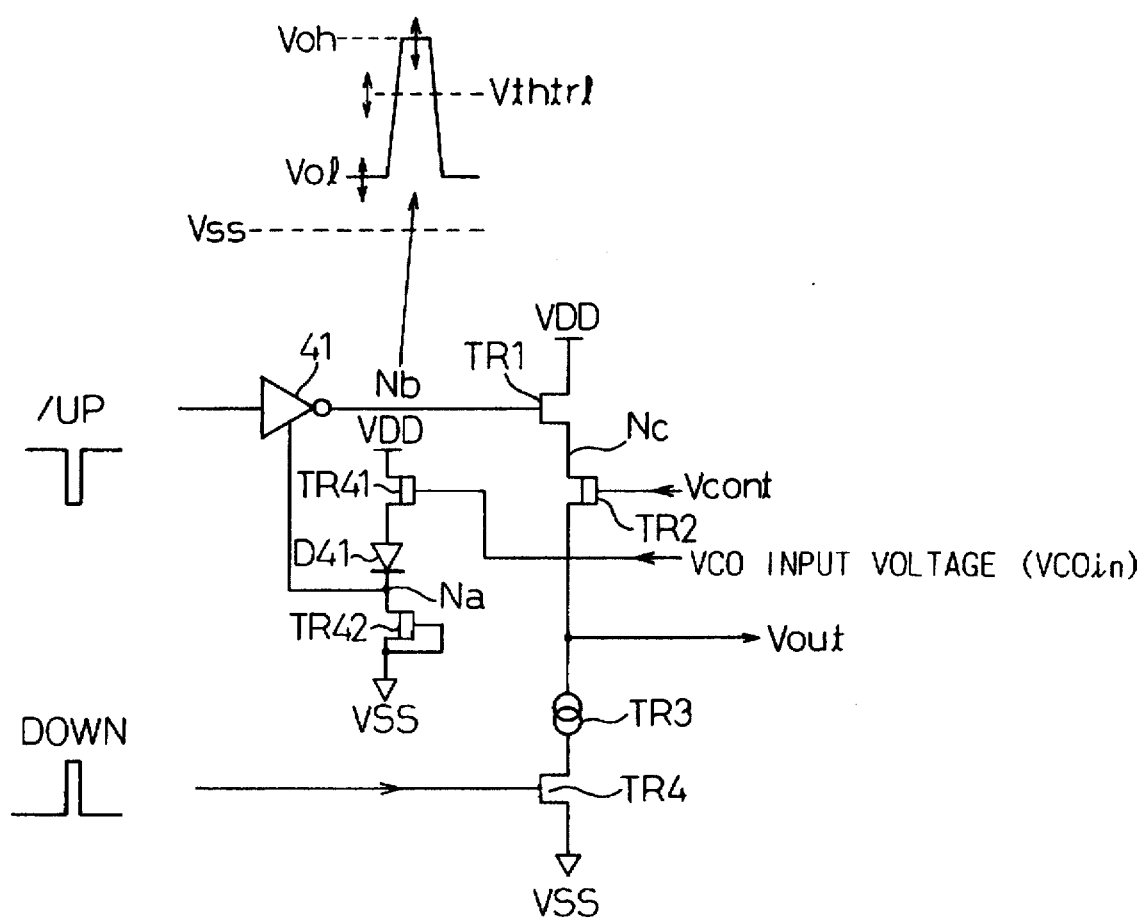
FIG. 13 shows an operation of the circuit of FIG. 12.

FIG. 13 shows the operation of the charge pump circuit of FIG. 12.

A voltage at a node Nb to turn on and off the transistor TR1 changes according to a voltage at a node Nc. The voltage at the node Nc changes according to the control voltage Vcont and the VCO input voltage. When the VCO input voltage changes, the voltage at the node Na changes accordingly, so that the low-level output Vol from the inverter 41 may change accordingly. As a result, an amplitude at the node Nb between the low voltage Vol and a voltage Vthtr1 to turn on the transistor TR1 is always small and constant, to improve the operation speed of the charge pump circuit.

Figure 14:
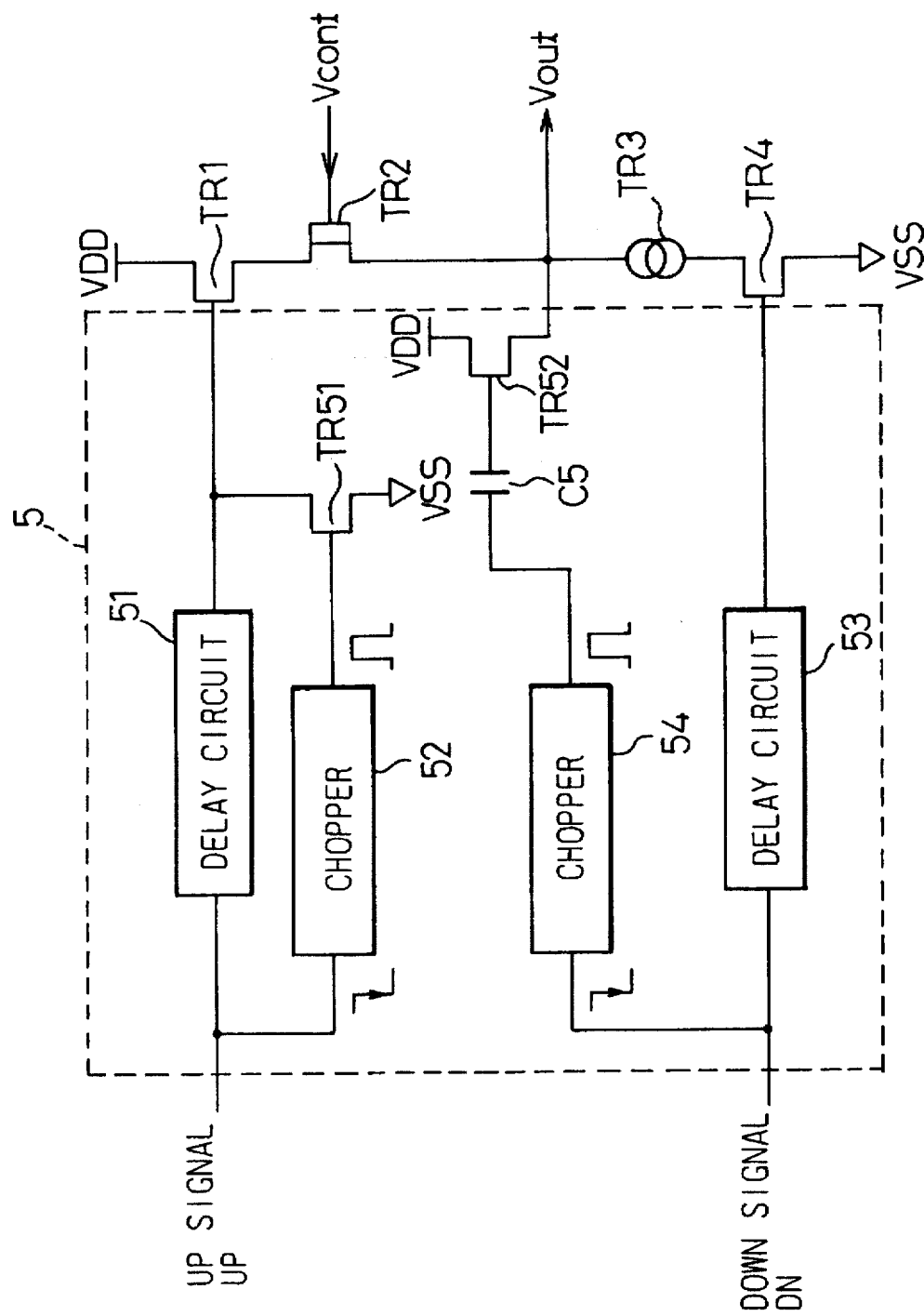
FIG. 14 shows a charge pump circuit according to a fifth embodiment of the present invention.
Figure 15:
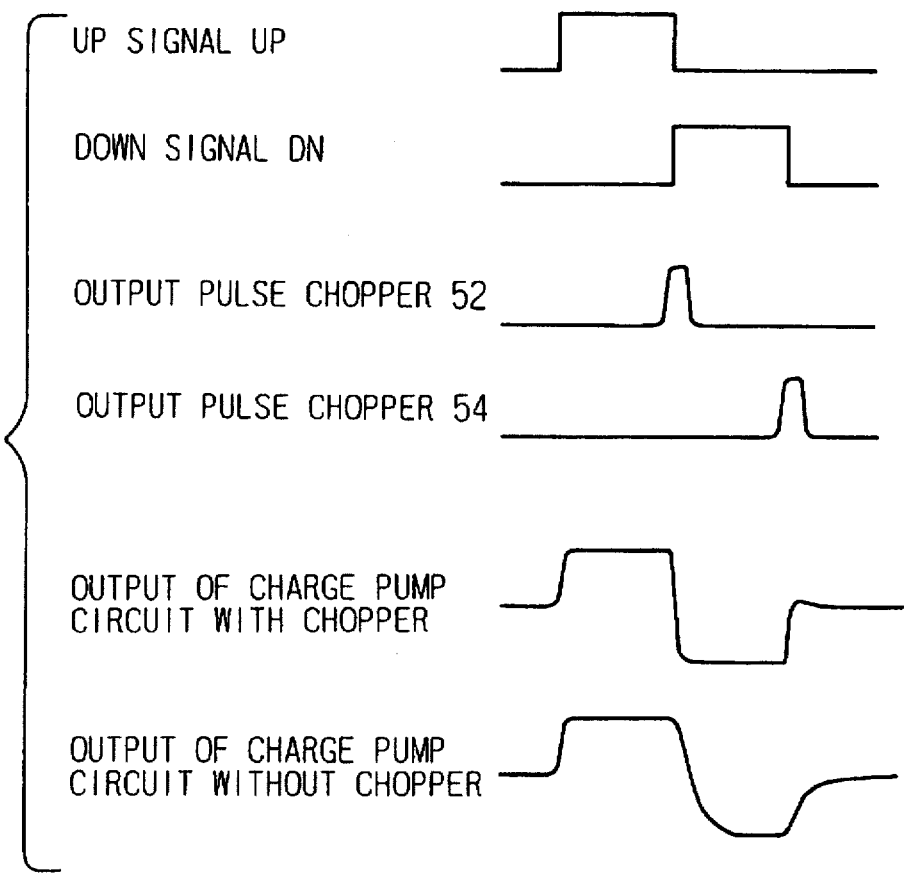
FIG. 15 shows an operation of the circuit of FIG. 14.

FIG. 14 shows a charge pump circuit according to the fifth embodiment of the present invention, and FIG. 15 shows the operation thereof. This embodiment improves the operation speed of the charge pump circuit.

The charge pump circuit has an up/down signal processor 5 consisting of delay circuits 51 and 53, choppers 52 and 54, n-type enhancement MESFETs TR51 and TR52, and a capacitor C5.

The chopper 52 generates a pulse in response to a falling edge of an up signal UP. The pulse is used to quicken the fall of the output of the charge pump circuit, thereby speeding up the switching of up and down outputs. Without this chopper, a fall of the output of the charge pump circuit is slow due to overlapping up and down signals UP and DN, to restrict the operation speed of the charge pump circuit.

The chopper 54 generates a pulse in response to a falling edge of the down signal DN. The pulse is used to quicken a rise of the output of the charge pump circuit even when the charge pump circuit moves to a high-impedance state. This is effective to remove the data rate dependency of the charge pump circuit.

In this way, the choppers 52 and 54 generate pulses when the up and down signals are switched from one to another, to drive the transistors TR51 and TR52. These transistors enhance each edge of the output of the charge pump circuit. Each of the delay circuits 51 and 53 may consist of two cascaded inverters, to adjust the timing of the up and down signals provided by the choppers 52 and 54.

The fifth embodiment arranges the up/down signal processor 5 after a phase comparator, to improve the operation speed of the charge pump circuit.

Until the PLL circuit is locked, the up signal UP may produce a narrow pulse which is hardly followed by the chopper 52. In this case, the chopper 52 does not work, and the charge pump circuit is shifted to strengthen the up signal UP. Then, the PLL circuit may be locked. This is a quasi-stable locked state involving a phase deviation, with respect to a normal locked state involving an allowable phase deviation. To solve this problem, the sixth embodiment extends the width of a positive pulse from the chopper 52.

Figure 16:
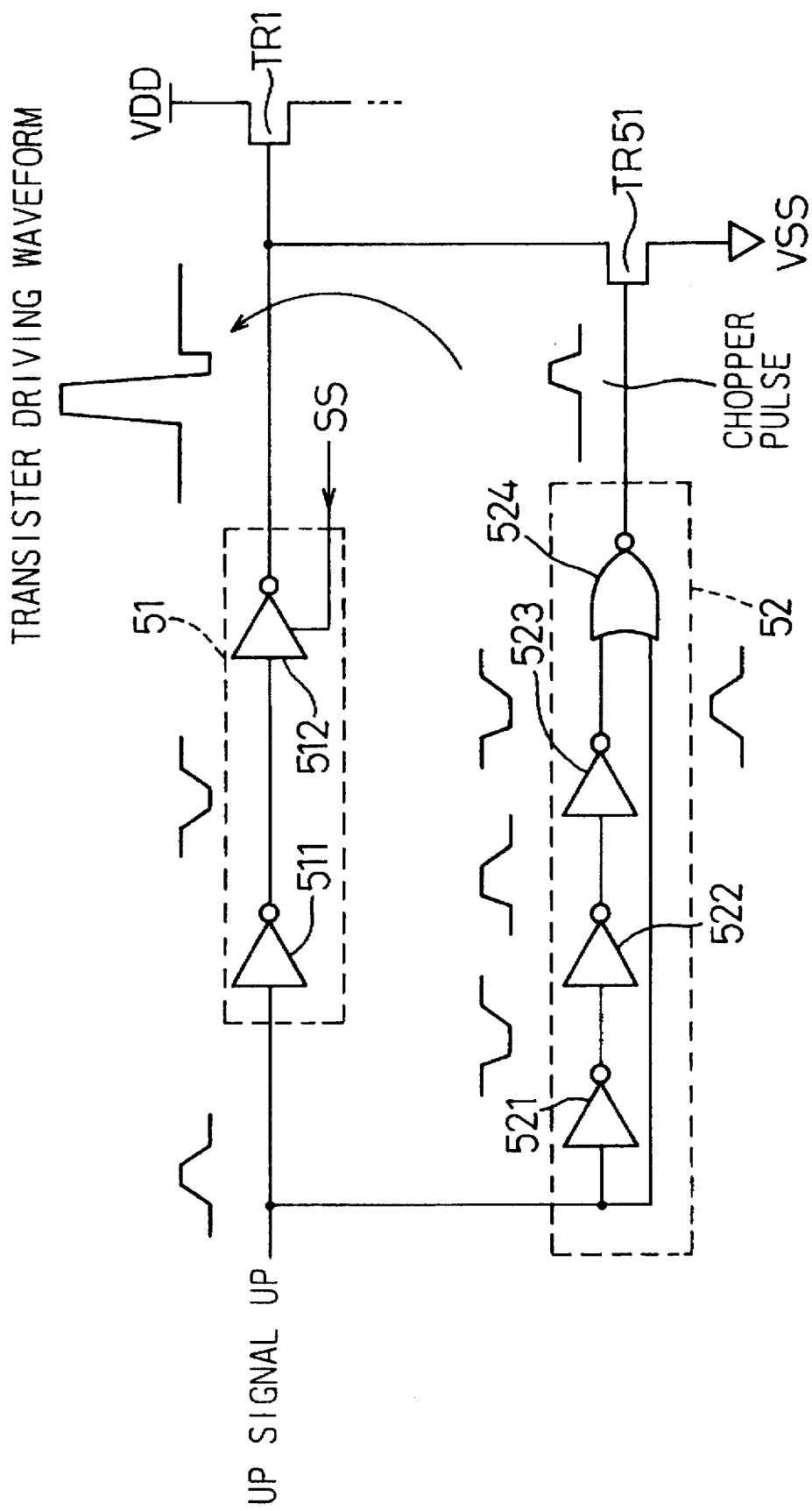
FIG. 16 shows a charge pump circuit according to a sixth embodiment of the present invention.

FIG. 16 shows a charge pump circuit having a delay circuit 51 and a chopper 52 according to the sixth embodiment. The chopper 52 operates at high speed to improve the operation speed of the charge pump circuit.

The delay circuit 51 consists of two cascaded inverters 511 and 512. The output of the inverter 512 is controlled according to an external control signal SS. The chopper 52 consists of three cascaded inverters 521 to 523 and a NOR gate 524. The output of the chopper 52 is supplied to the gate of a transistor TR51.

Figure 17:
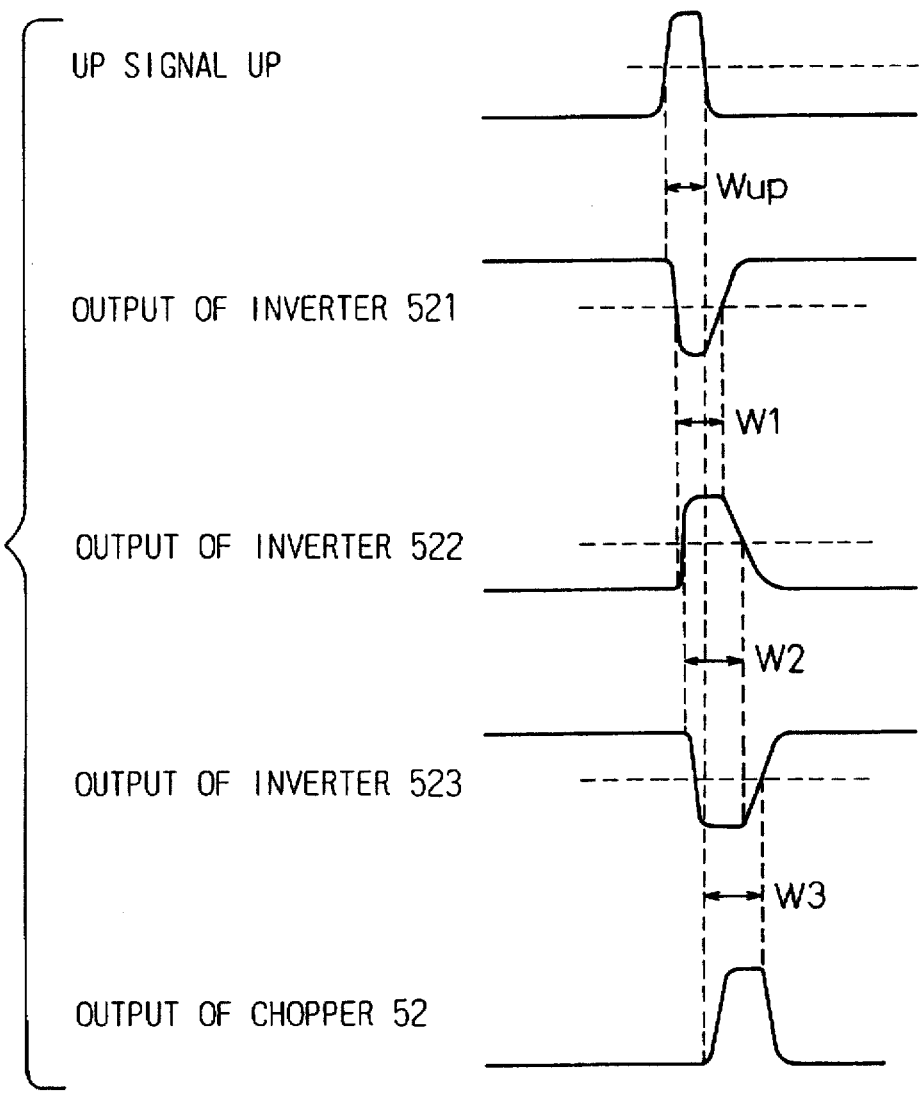
FIG. 17 shows an operation of the circuit of FIG. 16.

FIG. 17 shows the operation of the charge pump circuit of FIG. 16.

In each of the inverters 521 and 523 of the chopper 52, the delay time of a fall of the output thereof is smaller than that of a rise of the same. In the inverter 522, the delay time of a rise is smaller than that of a fall. When the inverter 521 transfers a pulse to the inverter 523, the width of an output pulse from the inverter 523 is wider than that of the input pulse thereto. Since a rising edge starts after a falling edge completes, the pulse width can be controlled according to a capacitor for controlling the width of a chopper pulse. If a fall of the inverter 523 is incomplete, the width of a chopper pulse will never be increased by increasing the size of the capacitor.

In this way, the sixth embodiment shortens the delay time of a rise of each even inverter and extends the delay time of a rise of each odd inverter, to widen a chopper pulse and surely switching the up and down operations of the charge pump circuit. This results in avoiding the quasi-stable locked state in response to a narrow up signal and stabilizing a high-speed operation of the charge pump circuit.

Any one of the fourth to sixth embodiments is capable of suppressing the data rate dependency of the output of the charge pump circuit and realizing a high-speed clock recovery circuit.

Each of the embodiments is able to make symmetrical the output amplitudes of the charge pump circuit for a wide range of VCO input voltages and minimize the influence of a fluctuation in the threshold voltage Vth of a transistor or in the characteristics of a diode. The embodiments are effective to reduce the data rate dependency of a clock recovery circuit and improve the performance of a PLL circuit that employs a narrow-band VCO.

Figure 18:
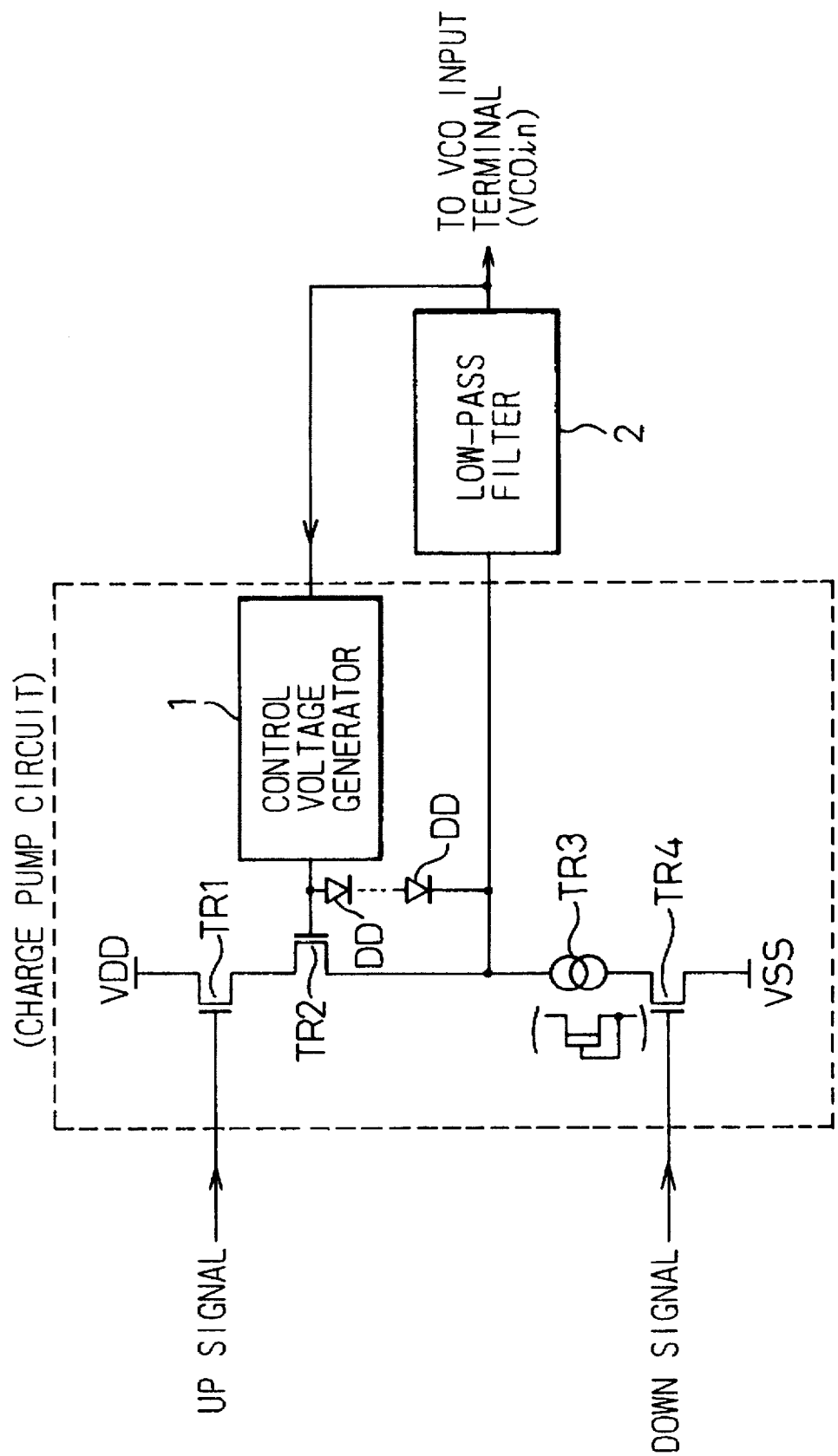
FIG. 18 shows a charge pump circuit according to a seventh embodiment of the present invention.

FIG. 18 shows a charge pump circuit according to the seventh embodiment of the present invention.

The first to sixth embodiments employ n-type MESFETs. On the other hand, the charge pump circuit of the seventh embodiment employs MOSFETs such as metal- and silicon-gate field effect transistors. A diode DD is inserted between the gate and source of a transistor TR2, to provide the same effect as the MESFET such as a Schottky-junction field effect transistor. The number of the diodes DD is at least one and is properly set to increase the degree of freedom of selecting the amplitude of an output signal of the charge pump circuit more than the one employing the MESFETs. When the MOSFETs are used, the input impedance is high, and therefore, one level shifter is sufficient for a control voltage generator 1.

The present invention is not limited to the MESFETs and MOSFETs. It may employ any other transistors such as HEMTs. The conduction type of the transistors and the polarities of up and down signals are optional.

Figure 19:
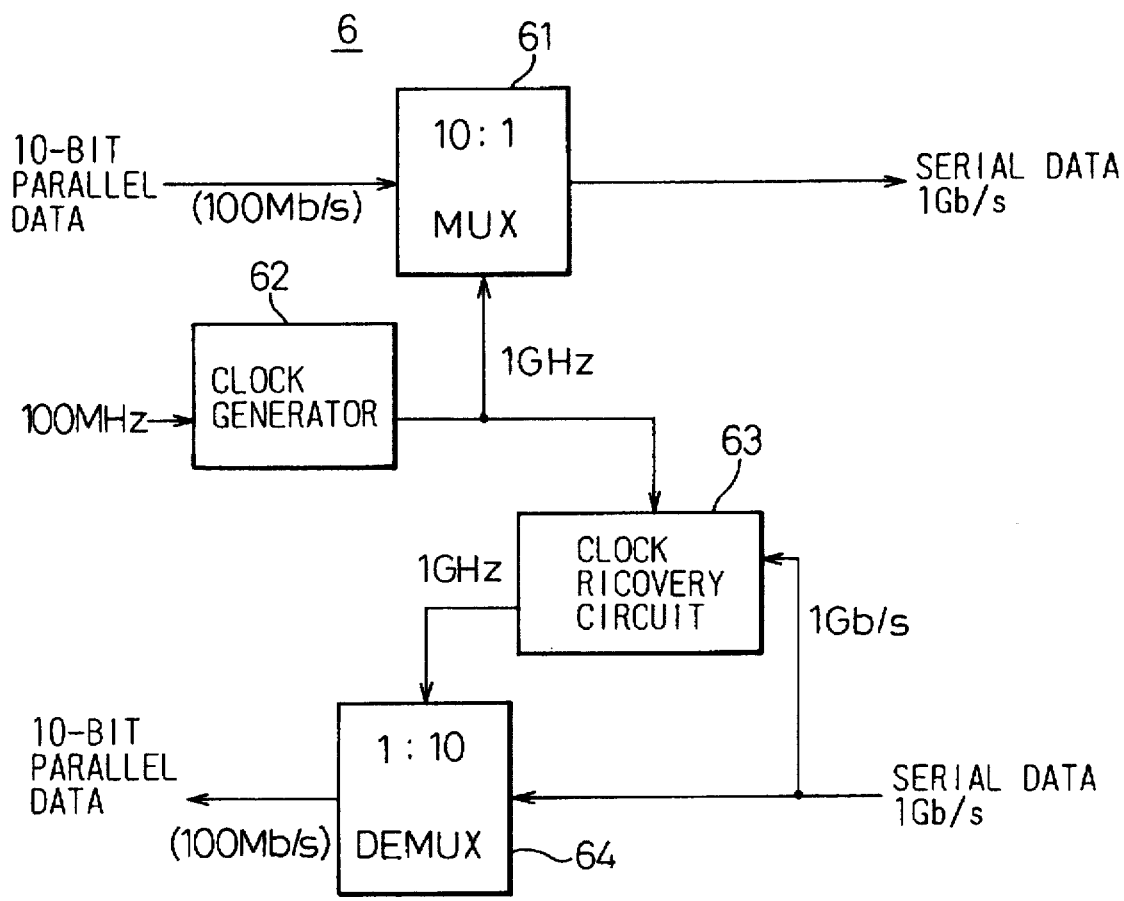
FIG. 19 shows a semiconductor integrated circuit employing a charge pump circuit according to the present invention.

FIG. 19 shows a fiber-channel transceiver IC employing a charge pump circuit according to the present invention. The IC has a multiplexer 61, a clock generator 62, a clock recovery circuit 63, and a demultiplexer 64.

The multiplexer 61 multiplexes 10-bit parallel data at low speed (for example, 100 Mb/s) into serial data at high speed (for example, 1 Gb/s). The multiplexer 61 receives a clock signal of 1 GHz from the clock generator 62.

The demultiplexer 64 demultiplexes high-speed serial data at 1 Gb/s into low-speed 10-bit parallel data at 100 Mb/s. The demultiplexer 64 receives a clock signal at 1 GHz from the clock recovery circuit 63. The clock recovery circuit 63 receives the serial data at 1 Gb/s and generates the clock signal at 1 GHz.

The charge pump circuit of the present invention is used for a PLL circuit that is incorporated in, for example, the clock recovery circuit 63.

Figure 20:
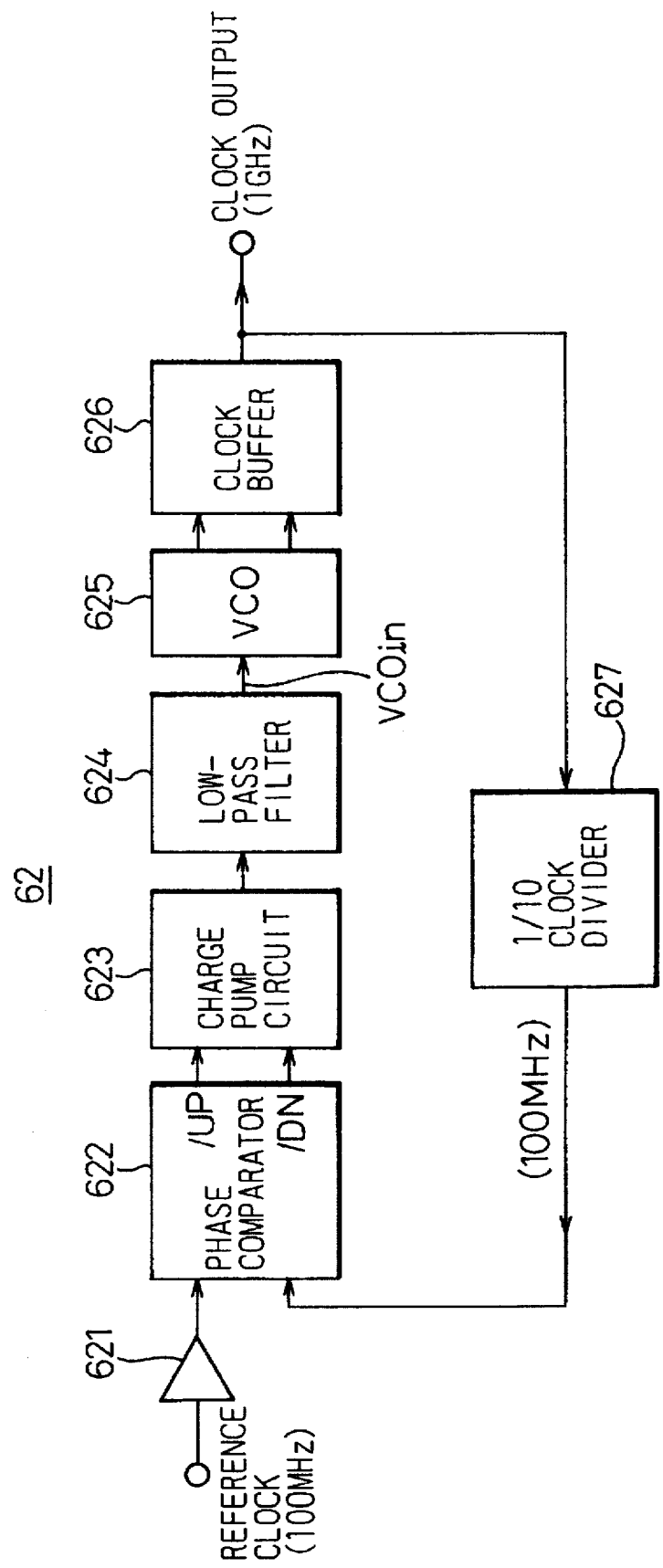
FIG. 20 shows a clock generator of the circuit of FIG. 19.

FIG. 20 shows an example of the clock generator 62 of FIG. 19.

The clock generator 62 has a PLL circuit, which consists of a phase comparator 622, a charge pump circuit 623, a low-pass filter (loop filter) 624, and a voltage-controlled oscillator (VCO) 625. The clock generator 62 also has a buffer 621 for shaping the waveform of a reference clock signal, and a clock buffer 626 for shaping the output of the VCO 625 into a given clock signal at, for example, 1 GHz. A clock divider 627 divides the clock output at 1 GHz by 10 and generates a signal at 100 MHz, which is compared with the reference clock signal at 100 MHz by the phase comparator 622, to carry out a PLL operation.

Figure 21:
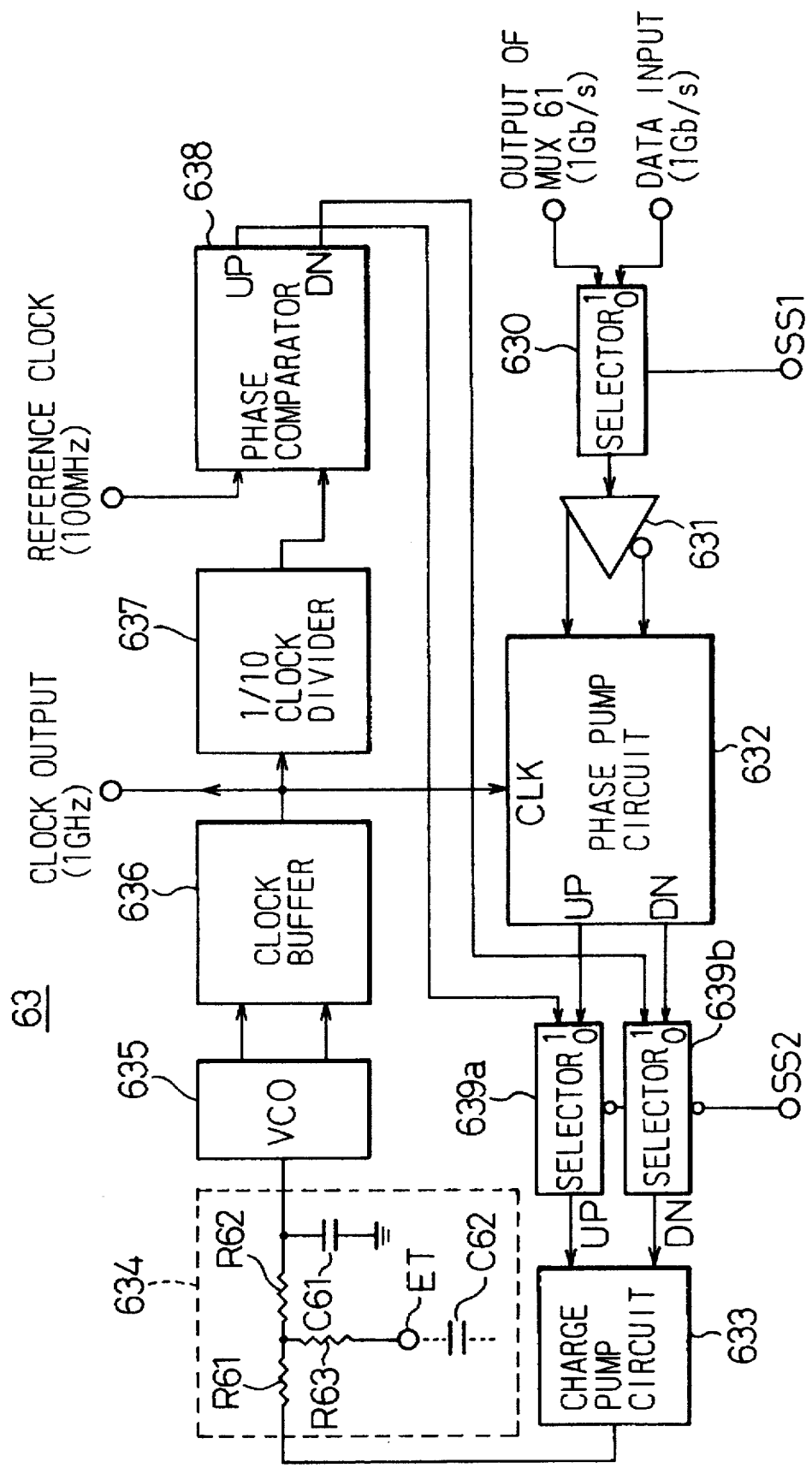
FIG. 21 shows a clock recovery circuit of the circuit of FIG. 19.

FIG. 21 shows an example of the clock recovery circuit 63 of FIG. 19.

The clock recovery circuit 63 has a PLL circuit, which consists of a phase comparator 632, a charge pump circuit 633, a low-pass filter (loop filter) 634, and a VCO 635. The low-pass filter 634 has resistors R61 to R63 and a capacitor C61, which are formed on a chip, as well as a large capacitor C62 that is formed outside the chip and is connected to a terminal ET.

A selector 630 selects, according to a select signal SS1, one of the serial input data at 1 Gb/s and the output of the multiplexer 61 at 1 Gb/s. A buffer 631 shapes the output of the selector 630 and supplies complementary signals to the phase comparator 632. A clock buffer 636 shapes the output of the VCO 635 and provides a clock signal at, for example, 1 GHz. A clock divider 637 divides the output of the clock buffer 636 of 1 GHz by 10 into a signal at 100 MHz, which is supplied to a phase comparator 638.

The phase comparator 632 compares the phases of the complementary output signals of the buffer 631 with the phase of the clock signal at 1 GHz from the clock buffer 636 and supplies a pair of up and down signals UP and DN to selectors 639a and 639b.

The phase comparator 638 compares the phases of the reference clock signal of 100 MHz and the output of the clock divider 637 with each other and supplies another pair of up and down signals UP and DN to the selectors 639a and 639b.

In response to a select signal SS2, the selectors 639a and 639b select the outputs (up and down signals) of the phase comparators 632 and 638. The selected signals are supplied to the charge pump circuit 633. The selectors 639a and 639b select, for example, the outputs of the phase comparator 638 at the start of the system or after a given period during which no input data is received. Thereafter, they select the outputs of the phase comparator 632.

Figure 22:
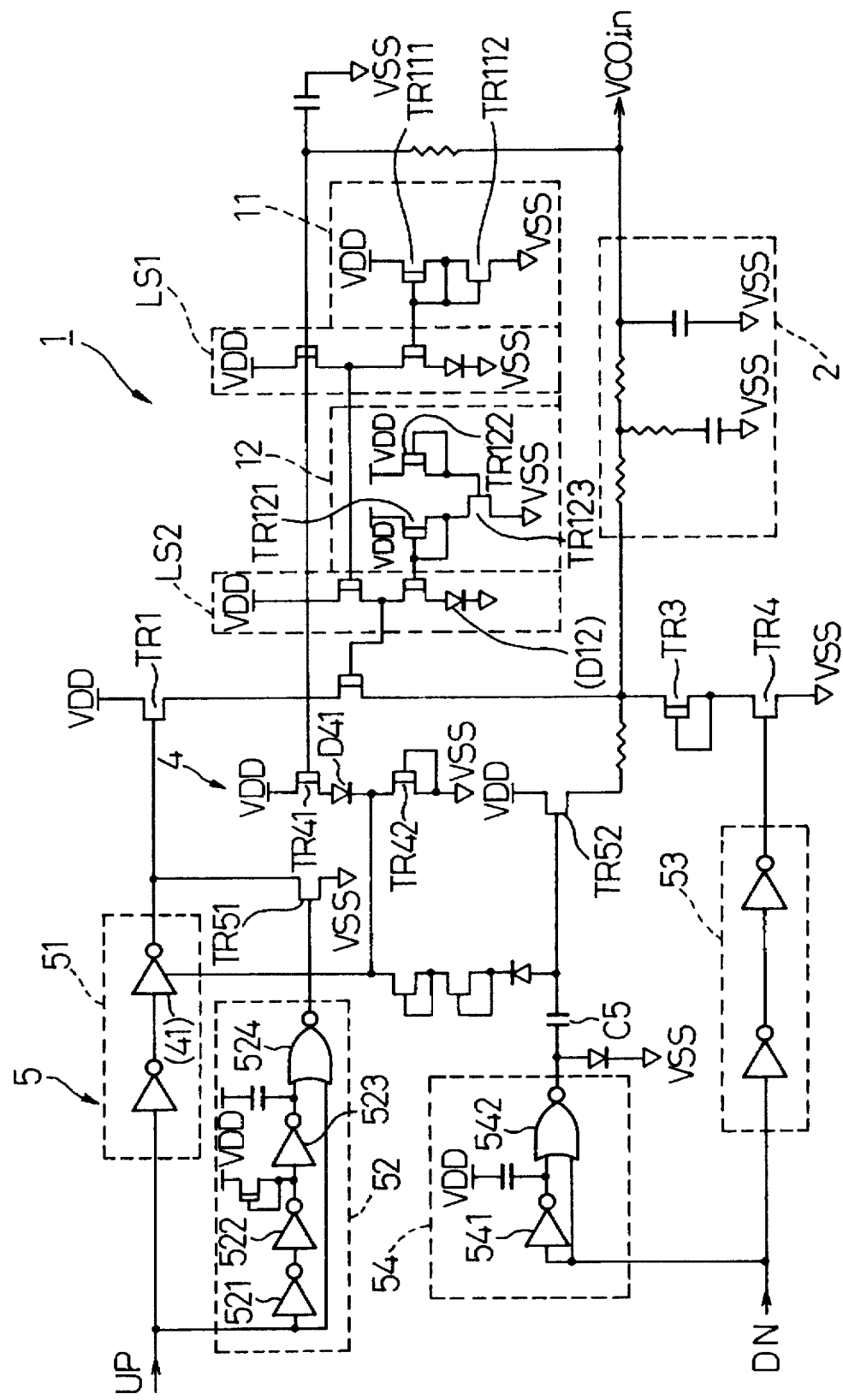
FIG. 22 shows the details of a charge pump circuit according to the present invention.

FIG. 22 shows the details of a charge pump circuit according to the present invention. This circuit is a combination of FIGS. 5, 8, 12, 14, and 16. Logic gate circuits such as inverters are each a direct coupled FET logic (DCFL) circuit of an E/D configuration.

A control voltage generator 1 consists of two level shifters LS1 and LS2. The level shifter LS1 has a bias generator 11, which uses the threshold voltage Vth of a DCFL circuit to provide a negative temperature coefficient that cancels the temperature characteristic of the level shifter LS1. Namely, the ratio of the sizes of transistors TR111 and TR112 is controlled to set a shifting level.

The level shifter LS2 has a bias generator 12, which uses a low-level output from a DCFL circuit to provide a positive temperature coefficient. Since it is impossible to greatly change the sizes of transistors TR121 to TR123 from one another, the strength of the bias generator 12 and the size of a diode D12 are optimized to provide a required temperature coefficient.

The circuit of FIG. 22 includes the clamp circuit 4 of FIG. 12 and the up/down signal processor 5 of FIGS. 14 and 16. Since the operations of these circuits have been explained already, they are not explained again.

Figure 23:
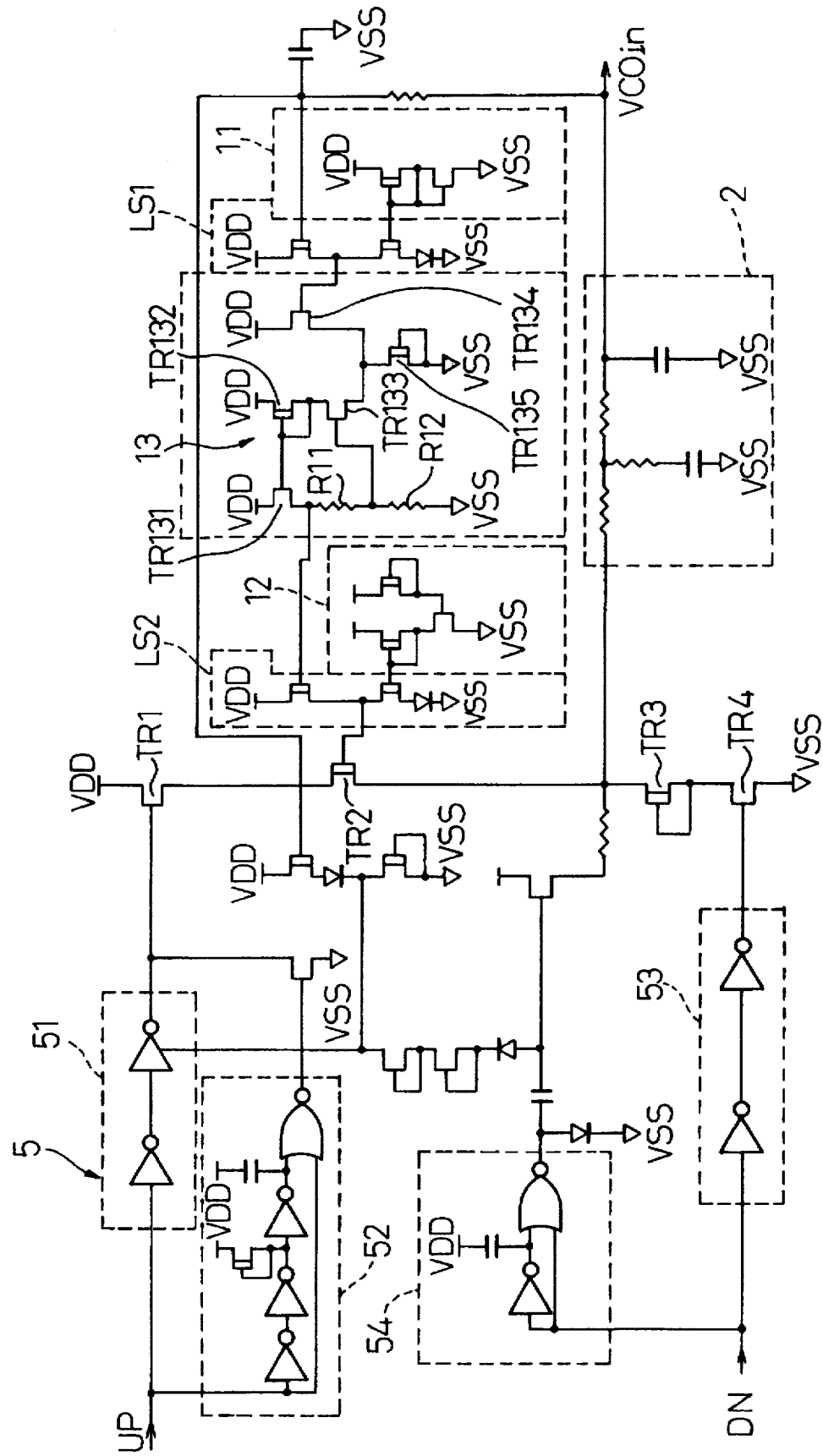
FIG. 23 shows the details of a charge pump circuit according to the present invention.

FIG. 23 shows the details of another charge pump circuit according to the present invention. This circuit has, in addition to the structure of FIG. 22, the arrangement of FIG. 10.

The circuit of FIG. 23 has a positive phase amplifier 13 between the level shifters LS1 and LS2, to provide a gain. The amplifier 13 consists of transistors TR131 to TR135. An input terminal of the amplifier 13 receives the output of the level shifter LS1. The output of the amplifier 13 is divided by resistors R11 and R12, and the divided voltage is inverted and fed back to the other input terminal of the amplifier 13. The operation of the amplifier 13 is the same as that of FIG. 10.

In this way, the embodiments of FIGS. 5 to 18 may be combined in various ways, to provide different structures of charge pump circuits.

As explained above, the present invention provides a charge pump circuit that has little data rate dependency and is suitable for high-speed operation. The present invention also provides a PLL circuit employing the charge pump circuit, capable of stably operating for a wide range of VCO input voltages, as well as a semiconductor integrated circuit employing the charge pump circuit.

Many different embodiments of the present invention may be constructed without departing from the spirit and scope of the present invention, and it should be understood that the present invention is not limited to the specific embodiments described in this specification, except as defined in the appended claims.

What is claimed is:

1. A charge pump circuit comprising:
   a first transistor connected to a first power source line and having a control electrode to receive a first control signal;
   a second transistor connected to a second power source line and having a control electrode to receive a second control signal;
   a third transistor and a current source connected in series between the first and second transistors, a node between the third transistor and the current source providing a signal, which is passed through a low-pass filter to provide a VCO input signal; and
   a control voltage generator for generating a control voltage according to the VCO input signal and applying the control voltage to a control electrode of the third transistor.

2. A charge pump circuit as claimed in claim 1, wherein the first and second transistors are enhancement transistors, and the third transistor and current source are depletion transistors.

3. A charge pump circuit as claimed in claim 1, wherein the first to third transistors and current source are Schottky-junction field effect transistors.

4. A charge pump circuit as claimed in claim 1, wherein the first to third transistors and current source are metal-gate or silicon-gate field effect transistors, and at least one diode is arranged between the control electrode of the third transistor and the node.

5. A charge pump circuit as claimed in claim 1, wherein the control voltage generator has two cascaded level shifters and two bias generators having different temperature coefficients to set separate temperature characteristics for shifting levels of the level shifters.

6. A charge pump circuit as claimed in claim 1, wherein the control voltage generator has a positive-phase amplifier having feedback resistors to adjust a gain.

7. A phase-locked loop circuit having a phase comparator for comparing phases of reference and output signals with each other, a charge pump circuit for receiving first and second control signals from the phase comparator and providing corresponding signals, a low-pass filter for filtering an output of the charge pump circuit into a VCO input signal, and a voltage-controlled oscillator for generating a signal whose frequency is determined by the VCO input signal, wherein the charge pump circuit comprises:
   a first transistor connected to a first power source line and having a control electrode to receive said first control signal;
   a second transistor connected to a second power source line and having a control electrode to receive said second control signal;
   a third transistor and a current source connected in series between the first and second transistors, a node between the third transistor and the current source providing a signal, which is passed through a low-pass filter to provide said VCO input signal; and
   a control voltage generator for generating a control voltage according to the VCO input signal and applying the control voltage to a control electrode of the third transistor.

8. A phase-locked loop circuit as claimed in claim 7, wherein the first and second transistors are enhancement transistors, and the third transistor and current source are depletion transistors.

9. A phase-locked loop circuit as claimed in claim 7, wherein the first to third transistors and current source are Schottky-junction field effect transistors.

10. A phase-locked loop circuit as claimed in claim 7, wherein the first to third transistors and current source are metal-gate or silicon-gate field effect transistors, and at least one diode is arranged between the control electrode of the third transistor and the node.

11. A phase-locked loop circuit as claimed in claim 7, wherein the control voltage generator has two cascaded level shifters and two bias generators having different temperature coefficients to set separate temperature characteristics for shifting levels of the level shifters.

12. A phase-locked loop circuit as claimed in claim 7, wherein the control voltage generator has a positive-phase amplifier having feedback resistors to adjust a gain.

13. A phase-locked loop circuit as claimed in claim 7, wherein the phase-locked loop circuit further comprises a clamp circuit for controlling the first control signal supplied to the control electrode of the first transistor, the clamp circuit receiving the VCO input signal and clamping an amplitude of the first control signal irrespective of a fluctuation in the VCO input signal.

14. A phase-locked loop circuit as claimed in claim 13, wherein the clamp circuit has an inverter, and a potential of the second power source line applied to the inverter is changed according to the VCO input signal.

15. A phase-locked loop circuit as claimed in claim 7, wherein the phase-locked loop circuit comprises a control signal processor arranged in front of the first and second transistors, to enhance the edges of the first and second control signals.

16. A phase-locked loop circuit as claimed in claim 15, wherein the control signal processor comprises:
   a first delay circuit for delaying the first control signal and supplying the delayed signal to the control electrode of the first transistor;
   a first chopper for generating a narrow pulse in response to a second edge of each pulse of the first control signal and using the pulse to enhance the second edge;
   a fourth transistor controlled by the output of the first chopper;
   a second delay circuit for delaying the second control signal and supplying the delayed signal to the control electrode of the second transistor;
   a second chopper for generating a narrow pulse in response to a second edge of each pulse of the second control signal and using the pulse to enhance the second edge; and
   a fifth transistor controlled by an output of the second chopper.

17. A phase-locked loop circuit as claimed in claim 16, wherein each of the first and second choppers includes an odd number of inverters and a two-input NOR gate, a corresponding one of the first and second control signals being supplied through the inverters to an input terminal of the NOR gate and directly to another input terminal of the NOR gate.

18. A semiconductor integrated circuit having a multiplexer for multiplexing low-speed parallel data composed of a plurality of bits into high-speed serial data, a clock generator for receiving a reference clock signal and generating a clock signal for the multiplexer, a demultiplexer for demultiplexing high-speed serial data into low-speed parallel data composed of a plurality of bits, and a clock recovery circuit for receiving the high-speed serial data and generating a clock signal for the demultiplexer, wherein the clock recovery circuit includes a phase-locked loop circuit having a phase comparator for comparing the phases of reference and output signals with each other, a charge pump circuit for receiving first and second control signals from the phase comparator and providing corresponding signals, a low-pass filter for filtering an output of the charge pump circuit into a VCO input signal, and a voltage-controlled oscillator for generating a signal whose frequency is determined by the VCO input signal, wherein the charge pump circuit comprises:

a first transistor connected to a first power source line and having a control electrode to receive said first control signal;

a second transistor connected to a second power source line and having a control electrode to receive said second control signal;

a third transistor and a current source connected in series between the first and second transistors, a node between the third transistor and the current source providing a signal, which is passed through a low-pass filter to provide said VCO input signal; and a control voltage generator for generating a control voltage according to the VCO input signal and applying the control voltage to a control electrode of the third transistor.

19. A semiconductor integrated circuit as claimed in claim 18, wherein the first and second transistors are enhancement transistors, and the third transistor and current source are depletion transistors.

20. A semiconductor integrated circuit as claimed in claim 18, wherein the first to third transistors and current source are Schottky-junction field effect transistors.

21. A semiconductor integrated circuit as claimed in claim 18, wherein the first to third transistors and current source are metal-gate or silicon-gate field effect transistors, and at least one diode is arranged between the control electrode of the third transistor and the node.

22. A semiconductor integrated circuit as claimed in claim 18, wherein the control voltage generator has two cascaded level shifters and two bias generators having different temperature coefficients to set separate temperature characteristics for shifting levels of the level shifters.

23. A semiconductor integrated circuit as claimed in claim 18, wherein the control voltage generator has a positive-phase amplifier having feedback resistors to adjust a gain.

24. A semiconductor integrated circuit as claimed in claim 18, wherein the semiconductor integrated circuit further comprises a clamp circuit for controlling the first control signal supplied to the control electrode of the first transistor, the clamp circuit receiving the VCO input signal and clamping an amplitude of the first control signal irrespective of a fluctuation in the VCO input signal.

25. A semiconductor integrated circuit as claimed in claim 24, wherein the clamp circuit has an inverter, and a potential of the second power source line applied to the inverter is changed according to the VCO input signal.

26. A semiconductor integrated circuit as claimed in claim 18, wherein the semiconductor integrated circuit comprises a control signal processor arranged in front of the first and second transistors, to enhance the edges of the first and second control signals.

27. A semiconductor integrated circuit as claimed in claim 26, wherein the control signal processor comprises:

a first delay circuit for delaying the first control signal and supplying the delayed signal to the control electrode of the first transistor;

a first chopper for generating a narrow pulse in response to a second edge of each pulse of the first control signal and using the pulse to enhance the second edge;

a fourth transistor controlled by the output of the first chopper;

a second delay circuit for delaying the second control signal and supplying the delayed signal to the control electrode of the second transistor;

a second chopper for generating a narrow pulse in response to a second edge of each pulse of the second control signal and using the pulse to enhance the second edge; and a fifth transistor controlled by an output of the second chopper.

28. A semiconductor integrated circuit as claimed in claim 27, wherein each of the first and second choppers includes an odd number of inverters and a two-input NOR gate, a corresponding one of the first and second control signals being supplied through the inverters to an input terminal of the NOR gate and directly to another input terminal of the NOR gate.

* * * * *